United States Patent
Wu et al.

(10) Patent No.: US 8,486,770 B1
(45) Date of Patent: Jul. 16, 2013

(54) METHOD OF FORMING CMOS FINFET DEVICE

(75) Inventors: Cheng-Hsien Wu, Hsinchu (TW);
Chih-Hsin Ko, Fongshan (TW);
Clement Hsingjen Wann, Carmel, NY (US)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 13/340,937

(22) Filed: Dec. 30, 2011

(51) Int. Cl.
*H01L 21/335* (2006.01)

(52) U.S. Cl.
USPC .......................................................... 438/142

(58) Field of Classification Search
CPC . H01L 29/785; H01L 29/517; H01L 21/31116;
H01L 21/3065; H01L 21/32137
USPC .................. 438/142, 285, 443, 695
See application file for complete search history.

(56) References Cited

U.S. PATENT DOCUMENTS

| 2008/0079060 | A1* | 4/2008 | Zhu ........................ 257/321 |
| 2010/0035425 | A1* | 2/2010 | Ryu et al. .............. 438/595 |
| 2011/0079829 | A1* | 4/2011 | Lai et al. ............... 257/288 |
| 2011/0101421 | A1* | 5/2011 | Xu ........................ 257/255 |
| 2013/0049138 | A1* | 2/2013 | Zhu et al. .............. 257/401 |

* cited by examiner

*Primary Examiner* — Nikolay Yushin
(74) *Attorney, Agent, or Firm* — Haynes and Boone, LLP

(57) ABSTRACT

A CMOS FinFET device and method for fabricating a CMOS FinFET device is disclosed. An exemplary CMOS FinFET device includes a substrate including a first region and a second region. The CMOS FinFET further includes a fin structure disposed over the substrate including a first fin in the first region and a second fin in the second region. The CMOS FinFET further includes a first portion of the first fin comprising a material that is the same material as the substrate and a second portion of the first fin comprising a III-V semiconductor material deposited over the first portion of the first fin. The CMOS FinFET further includes a first portion of the second fin comprising a material that is the same material as the substrate and a second portion of the second fin comprising a germanium (Ge) material deposited over the first portion of the second fin.

20 Claims, 31 Drawing Sheets

METHOD OF FORMING CMOS FINFET DEVICE

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, challenges from both fabrication and design have resulted in the development of fin-like field effect transistor (FinFET) devices. The FinFET device, for example, may be a complementary metal-oxide-semiconductor (CMOS) device comprising a P-type metal-oxide-semiconductor (PMOS) FinFET device and a N-type metal-oxide-semiconductor (NMOS) FinFET device. Although existing FinFET devices and methods of fabricating FinFET devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
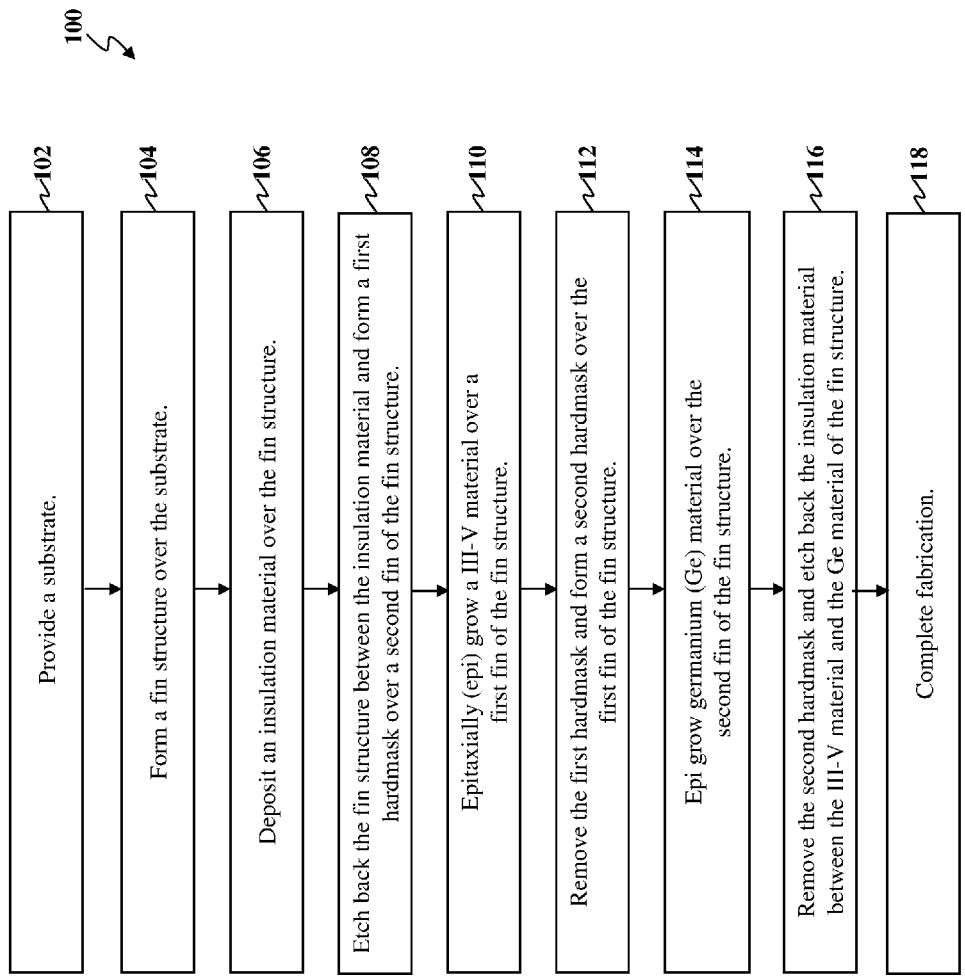
FIG. 1 is a flowchart illustrating a method of fabricating a semiconductor device according to various aspects of the present disclosure.

The following disclosure provides many different embodiments, or examples, for implementing different features of the application. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present application.

Examples of devices that can benefit from one or more embodiments of the present application are semiconductor devices. Such a device, for example, is a fin-like field effect transistor (FinFET). The FinFET device, for example, may be a complementary metal-oxide-semiconductor (CMOS) device comprising a P-type metal-oxide-semiconductor (PMOS) FinFET device and a N-type metal-oxide-semiconductor (NMOS) FinFET device. The following disclosure will continue with a CMOS FinFET example to illustrate various embodiments of the present application. It is understood, however, that the application should not be limited to a particular type of device, except as specifically claimed.

With reference to FIGS. 1 and 2-13, a method 100 and a semiconductor device 200 are collectively described below. FIG. 1 is a flow chart of a method 100 for fabricating an integrated circuit device according to various aspects of the present disclosure. In the present embodiment, the method 100 is for fabricating an integrated circuit device that includes a complementary metal-oxide-semiconductor (CMOS) fin-like field effect transistor (FinFET) device. The method 100 begins at block 102 where a substrate including first and second regions is provided. At block 104, a fin structure is formed over the substrate. The formation of the fin structure may include patterning a mask layer and etching the semiconductor substrate using the mask layer. At block 106, an insulation material is deposited over the fin structure. The insulation material may be deposited such that it covers the fin structure. A planarizing process may be performed such that the top surface of the insulation material is planarized, exposing the top portion of the fin structure. The method continues with block 108 where the fin structure is etched back between the insulation material and a first hardmask is formed over a second fin in the second region of the substrate and a first fin in the first region of the substrate is exposed. At block 110, a type III-V material is epitaxially (epi) grown over the exposed first fin of the fin structure. At block 112, the first hardmask is removed and a second hardmask is formed over the first fin of the fin structure in the first region and the second fin of the fin structure in the second region is exposed. At block 114, germanium (Ge) is epi grown over the exposed second fin of the fin structure. It is understood that, alternatively, the method 100 may be implemented by forming the first hardmask on the first region and epi growing Ge over the exposed second fin of the second region and thereafter forming a second hardmask over the second region and epi growing the III-V material over the exposed first fin in the first region. At block 116, the second hardmask is removed and the insulation material is etched back between the III-V material and the Ge material of the fin structure. The method 100 continues with block 118 where fabrication of the integrated circuit device is completed.

Completing the fabrication process may include, among other things, forming a gate stack over a channel region of the fin structure and forming source and drain (S/D) feature in a S/D region of the semiconductor device. Forming the gate stack may be a gate first or a gate last process. For example, in a gate first process, forming the gate stack may include depositing a dielectric layer over the fin structure in the central region, forming a gate structure (e.g., gate electrode) over the dielectric layer, and forming gate spacers on the walls of the gate structure and adjacent to the S/D region of the semiconductor device. Thereafter, a S/D feature may be formed in the S/D region by recessing the semiconductor material in the S/D region and depositing a doped semiconductor material in the S/D region. The deposition of the doped semiconductor material may include epi growing the semiconductor material. Additional steps can be provided before, during, and after the method 100, and some of the steps described can be replaced or eliminated for other embodiments of the method. The discussion that follows illustrates various embodiments of a semiconductor device that can be fabricated according to the method 100 of FIG. 1.

FIGS. 2-13 illustrate diagrammatic cross-sectional side views of one embodiment of a semiconductor device at various stages of fabrication, according to the method of FIG. 1. In the present disclosure, the semiconductor device is a CMOS FinFET device 200. The CMOS FinFET device 200 includes a NMOS FinFET device and a PMOS FinFET device. The FinFET device 200 may be included in a microprocessor, memory cell, and/or other integrated circuit device. FIGS. 2-13 have been simplified for the sake of clarity to better understand the inventive concepts of the present disclosure. Additional features can be added in the CMOS FinFET device 200, and some of the features described below can be replaced or eliminated in other embodiments of the CMOS FinFET device 200.

Figure 2:
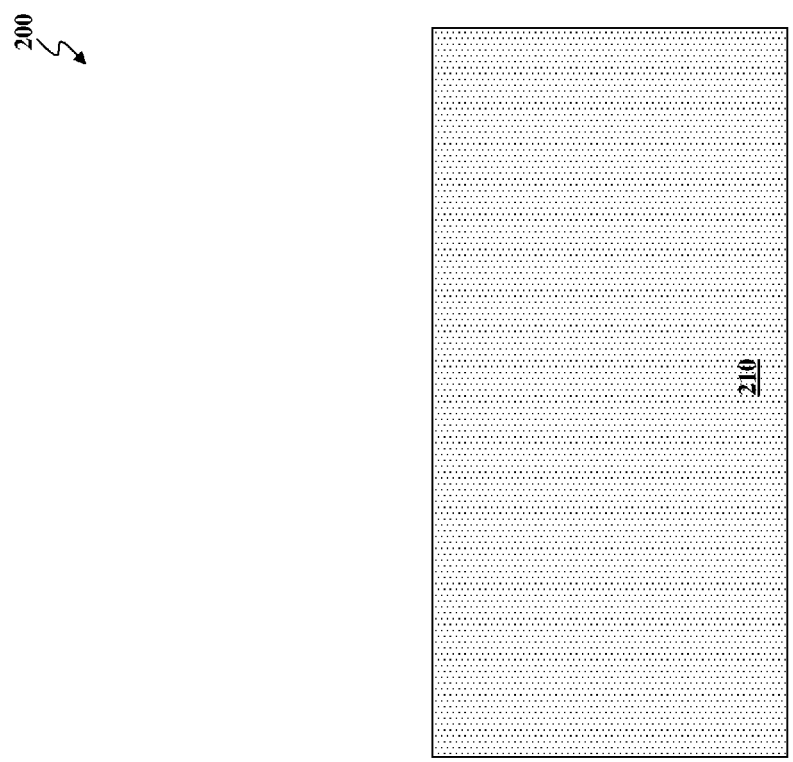
FIGS. 2-13 illustrate diagrammatic cross-sectional side views of one embodiment of a semiconductor device at various stages of fabrication, according to the method of FIG. 1.

Referring to FIG. 2, the FinFET device 200 includes a substrate (e.g., wafer) 210. The substrate 210 is a bulk silicon substrate. Alternatively, the substrate 210 comprises an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Alternatively, the substrate 210 includes a silicon-on-insulator (SOI) substrate. The SOI substrate can be fabricated using separation by implantation of oxygen (SIMOX), wafer bonding, and/or other suitable methods. The substrate 210 may include various doped regions and other suitable features.

Figure 3:
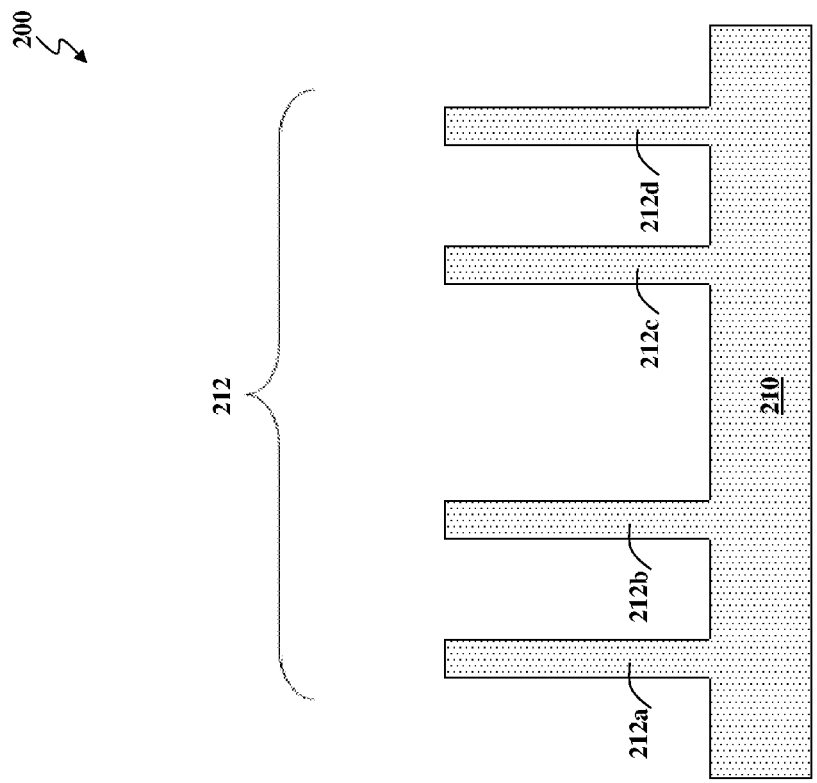

Referring to FIG. 3, fin structure 212 (including a plurality of fins 212a-212d) is formed by any suitable process, such as a photolithography and etching process. For example, in the present embodiment, the fin structure 212 is formed by exposing a photoresist layer to a pattern, performing a post-exposure bake process, and developing the photoresist layer to form a masking element including the photoresist layer and the mask layer. In some embodiments, the photoresist layer patterning may include processing steps of photoresist coating, soft baking, mask aligning, exposing pattern, post-exposure baking, developing photoresist, and hard baking. In some embodiments, the patterning can also be implemented or replaced by other proper methods, such as maskless photolithography, electron-beam writing, ion-beam writing, and molecular imprint. The masking element (including the photoresist layer and the mask layer) can then be used in an etching process to etch the fin structure 212 into the substrate 210. The etching process uses the patterned mask layer to define the area to be etched and to protect other regions of the CMOS FinFET device 200. In some embodiments, the etching process includes a wet etching process, a dry etching process, or a combination thereof. The fin structure 212 may be formed by an etching process using a reactive ion etch (RIE) and/or other suitable process. In one example, a hydrofluoric acid (HF) or buffered HF is used to etch the dielectric layer to expose the substrate 210 according to the pattern defined by the mask layer. In another example, a dry etching process used to etch the substrate 210 includes a chemistry including fluorine-containing gas. In furtherance of the example, the chemistry of the dry etch includes CF4, SF6, or NF3. Alternatively, the fin structure 212 is formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including double exposure (e.g., using two mask sets).

Figure 4:
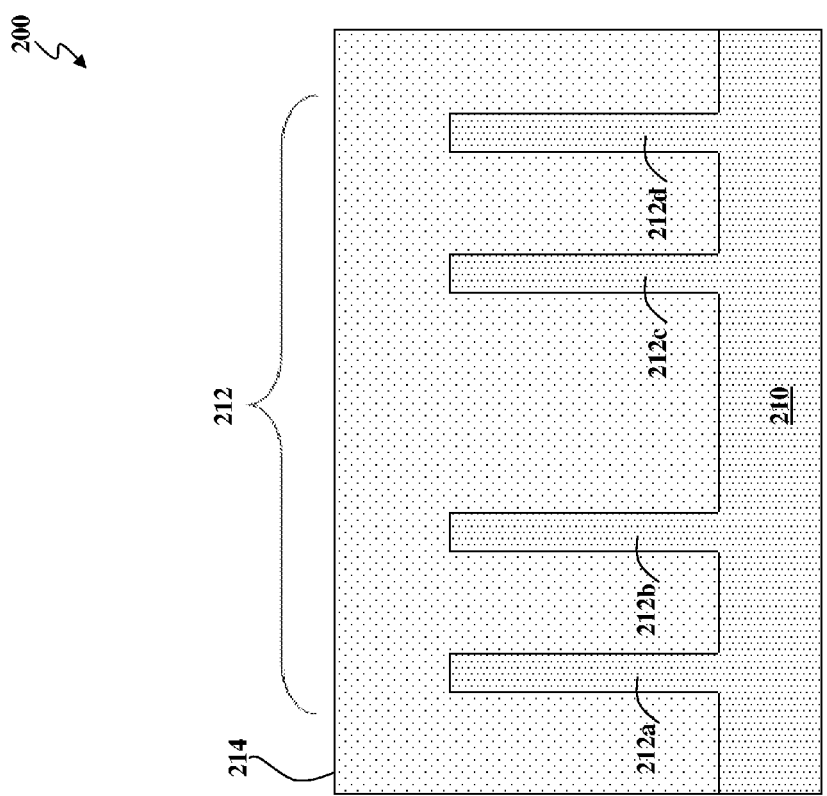

Referring to FIG. 4, deposited over the substrate 210 (and over the fin structure 212) is an insulation material 214. The insulation material 214 is deposited such that the insulation material 214 surrounds and isolates each fin 212a-212d of the fin structure 212 from other fins. In some embodiments, the insulation material 214 includes an insulating material such as silicon oxide, silicon nitride, silicon oxynitride, low k materials, air gap, other suitable material, or any combinations thereof. In the present embodiment, the insulation material 214 includes silicon oxide. The silicon oxide can be deposited by a CVD process. In various examples, the silicon oxide can be formed by atomic layer deposition (ALD), high density plasma CVD (HDPCVD), other suitable methods, and/or combinations thereof. The silicon oxide may be alternatively formed by a high aspect ratio process (HARP). In various embodiments, an optional thermal oxide trench liner is grown to improve the trench interface. The CVD process, for example, can use chemicals including Hexachlorodisilane (HCD or Si2Cl6), Dichlorosilane (DCS or SiH2Cl2), Bis (TertiaryButylAmino) Silane (BTBAS or C8H22N2Si) and Disilane (DS or Si2H6). In some embodiments, the insulation material 214 can have a multi-layer structure, for example, a thermal oxide liner layer with silicon nitride formed over the liner.

Figure 5:
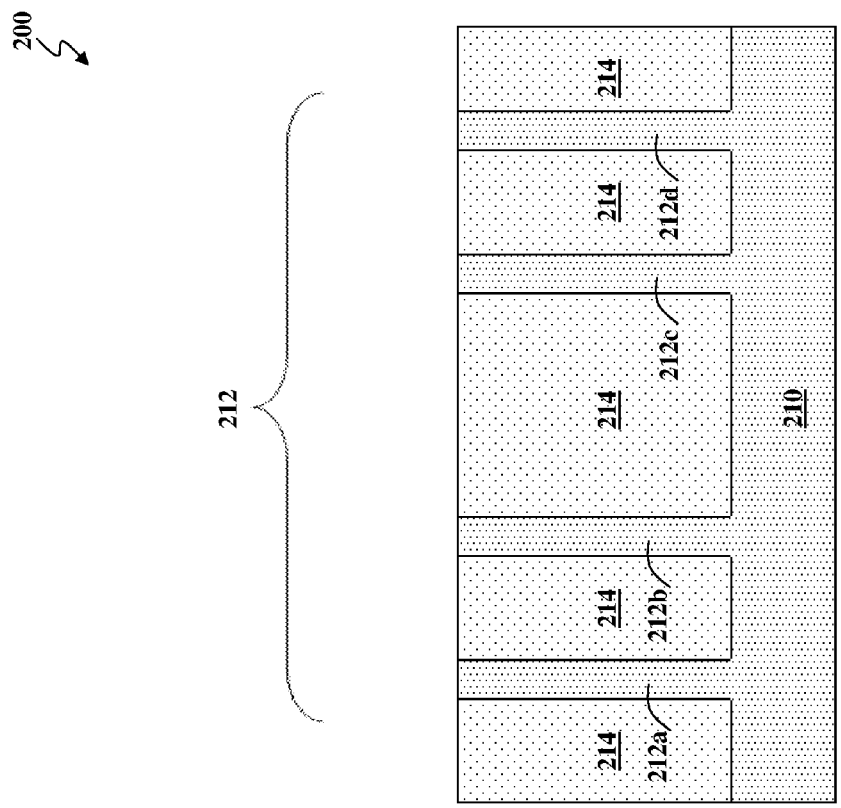

Referring to FIG. 5, a planarizing process is performed on the CMOS FinFET device 200. In one embodiment, the planarizing process includes a chemical mechanical polishing (CMP) process applied to the CMOS FinFET device 200 to remove excessive portions of the insulation material 214. The planarizing process may be performed such that the top portion of the fin structure 212 is exposed.

Figure 6:
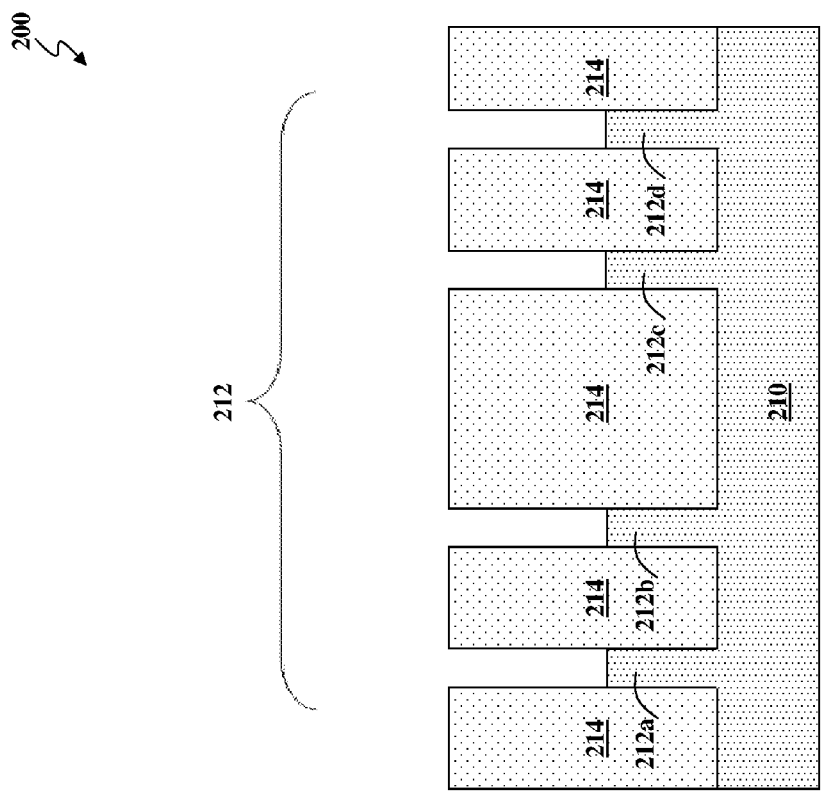

Referring to FIG. 6, an etching process is used to etch-back the material of the fin structure 212 in between the insulation material 214 thereby forming a plurality of trenches corresponding to the fins 212a-212d, of the fin structure 212. The plurality of trenches have sidewalls defined by the surrounding insulation material 214 and a bottom surface, opposing the opening, being defined by the top surface of the underlying fin (e.g., fin 212a-212d) of the fin structure 212. In some embodiments, the etching process that is used to etch-back the material of the fin structure 212 includes a wet etching, a dry etching process, or a combination thereof. In one example, a dry etching process may include forming a photoresist layer, patterning the photoresist layer, etching each fin 212a-212d of the fin structure 212, and removing the photoresist layer. In furtherance of the example, the dry etching process used to etch the fin material includes a chemistry including fluorine-containing gas.

Figure 7:
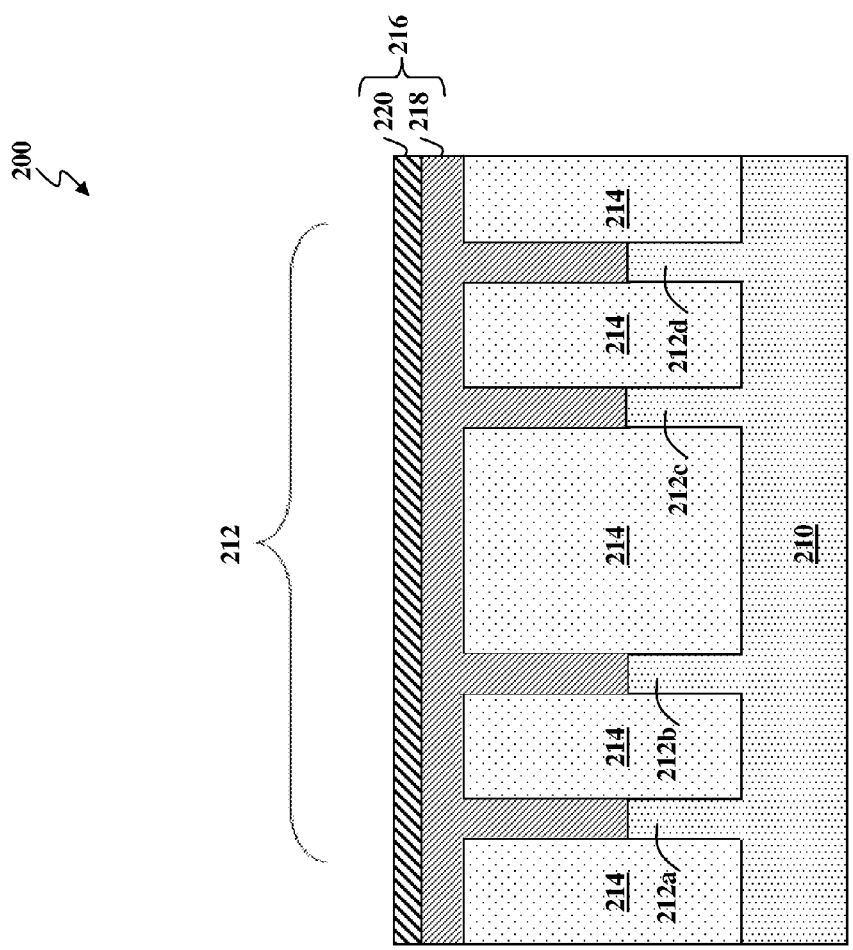

Referring to FIG. 7, a first hardmask 216 is formed over the substrate 210. In some embodiments, forming the first hardmask 216 includes depositing an oxide layer 218 and a nitride layer 220 over the fin structure 212. The hardmask 216 is formed by any suitable process to any suitable thickness. In the present embodiment, the first hardmask 216 is formed by a CVD process. In various examples, the first hardmask 216 can be formed by atomic layer deposition (ALD), high density plasma CVD (HDPCVD), other suitable methods, and/or combinations thereof. The CVD process, for example, may use chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6).

Figure 8:
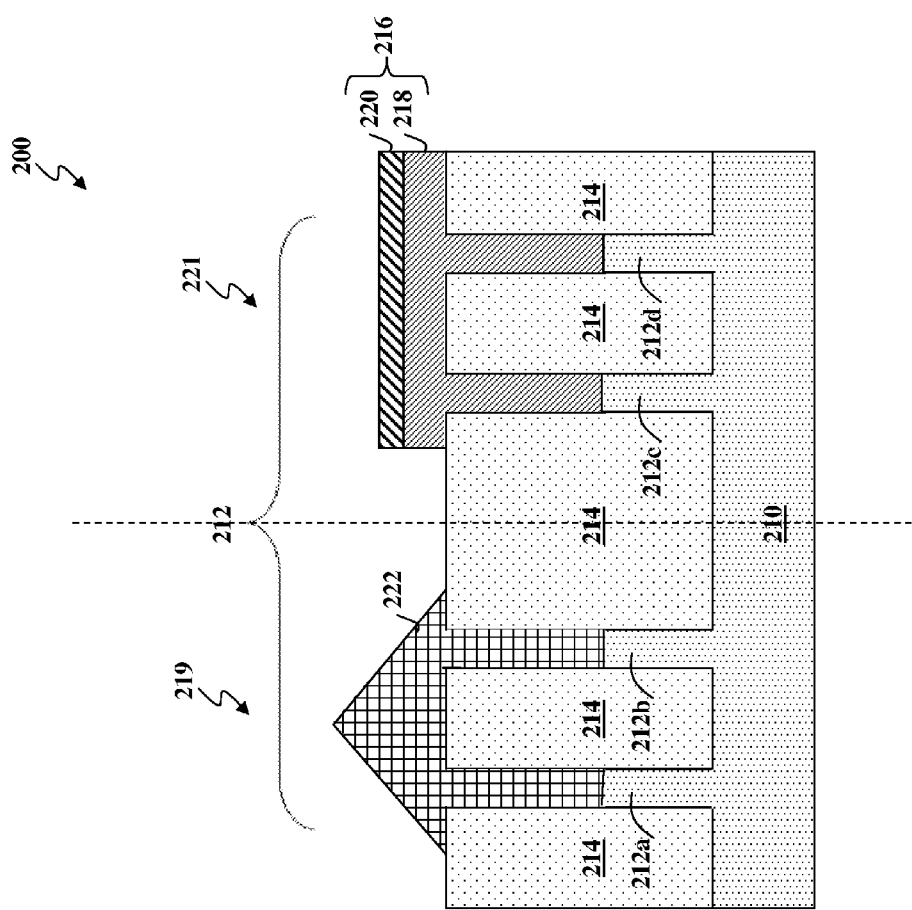

Referring to FIG. 8, a portion of the first hardmask 216 is patterned such that it exposes a first region 219 of the substrate 210 and protects a second region 221 of the substrate 210. The first region 219 includes fins (e.g., 212a and 212b) of the fin structure 212 and the second region 221 includes fins (e.g., 212c and 212d) of the fin structure 212. In the present embodiment, the first region 219 defines a NMOS region of the CMOS FinFET device 200 and the second region 221 defines a PMOS region of the CMOS FinFET device 200. In some embodiments, the first hardmask 216 is patterned by any suitable process such as a photolithography process and an etching process. For example, after forming the first hardmask 216 a photoresist layer is deposited over the first hardmask 216. Thereafter, the photoresist layer is exposed to a pattern, a post-exposure bake process is performed, and the photoresist layer is developed to form a pattern. The photoresist layer patterning may include processing steps of photoresist coating, soft baking, mask aligning, exposing pattern, post-exposure baking, developing photoresist, and hard baking. After the photoresist pattern is formed, an etching process may be used to remove portions of the first hardmask 216 such that the remaining portion of the first hardmask 216 only covers the second region 221 of the substrate 210 thereby exposing the first region 219 of the substrate 210. Exposing the first region 219 of the substrate 210 includes exposing a top surface of the fins 212a and 212b.

Still referring to FIG. 8, a III-V material 222 is epi grown over the exposed surface of the fins 212a and 212b, in the first region 219 of the substrate 210. In the present embodiment, the III-V material 222 includes a type III-V material such as InAs, InGaAs, InGaSb, InP, AlSb, and the like formed by an epitaxy process. The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition (e.g., silicon) of the fin structure 212.

Figure 9:
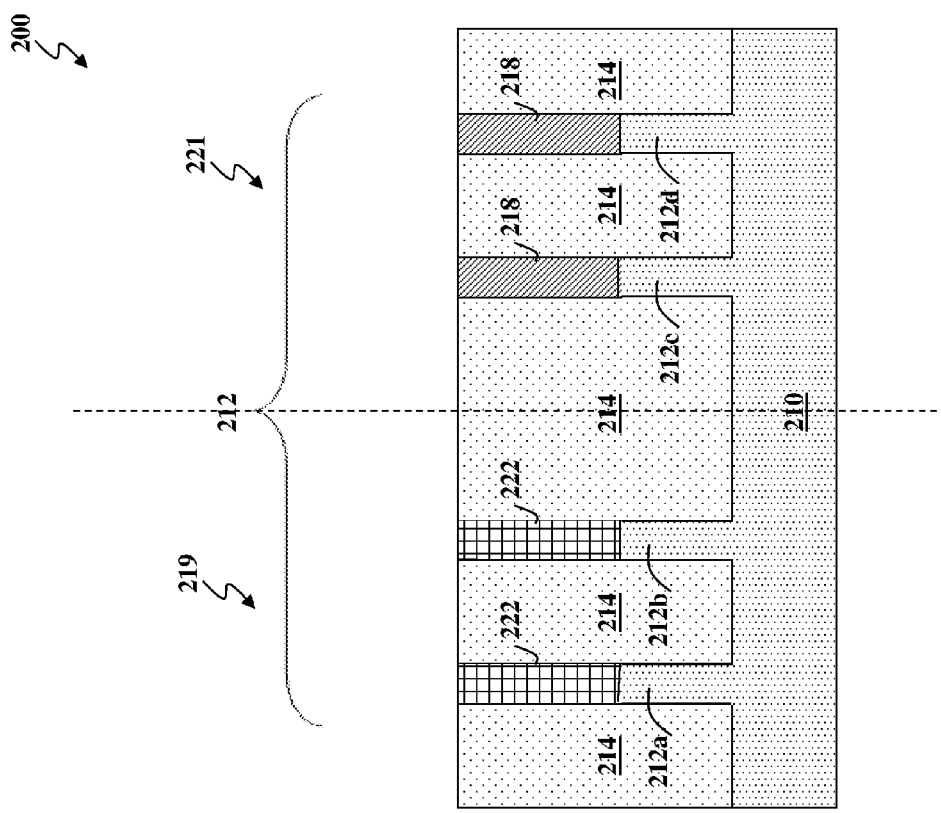

Referring to FIG. 9, a planarizing process is performed on the CMOS FinFET device 200. In the present embodiment, the planarizing process includes a chemical mechanical polishing (CMP) process applied to the first region 219 and the second region 221 of the CMOS FinFET device 200 to remove excessive portions of the III-V material 222 and the first hardmask 216. In some embodiments, the planarizing process is performed such that a top surface of the III-V material 222 of the fins 212a and 212b (of the fin structure 212) is in the same plane as a top surface of the oxide layer 218 of the first hardmask 216 overlying fins 212c and 212d, (of the fin structure 212).

Figure 10:
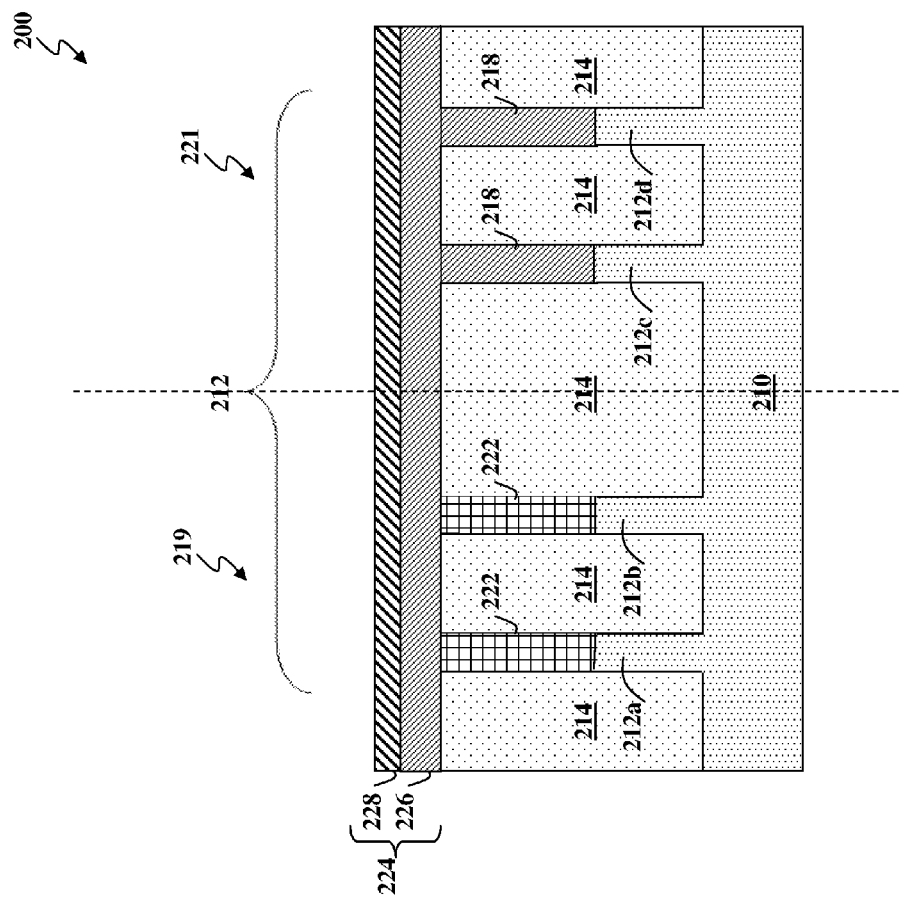

Referring to FIG. 10, a second hardmask 224 is formed over the substrate 210. Forming the second hardmask 224 includes depositing an oxide layer 226 and a nitride layer 228 over the fin structure 212. The second hardmask 224 is formed by any suitable process to any suitable thickness. In the present embodiment, the second hardmask 224 is formed by a CVD process. In various examples, the second hardmask 224 can be formed by atomic layer deposition (ALD), high density plasma CVD (HDPCVD), other suitable methods, and/or combinations thereof. The CVD process, for example, may use chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6).

Figure 11:
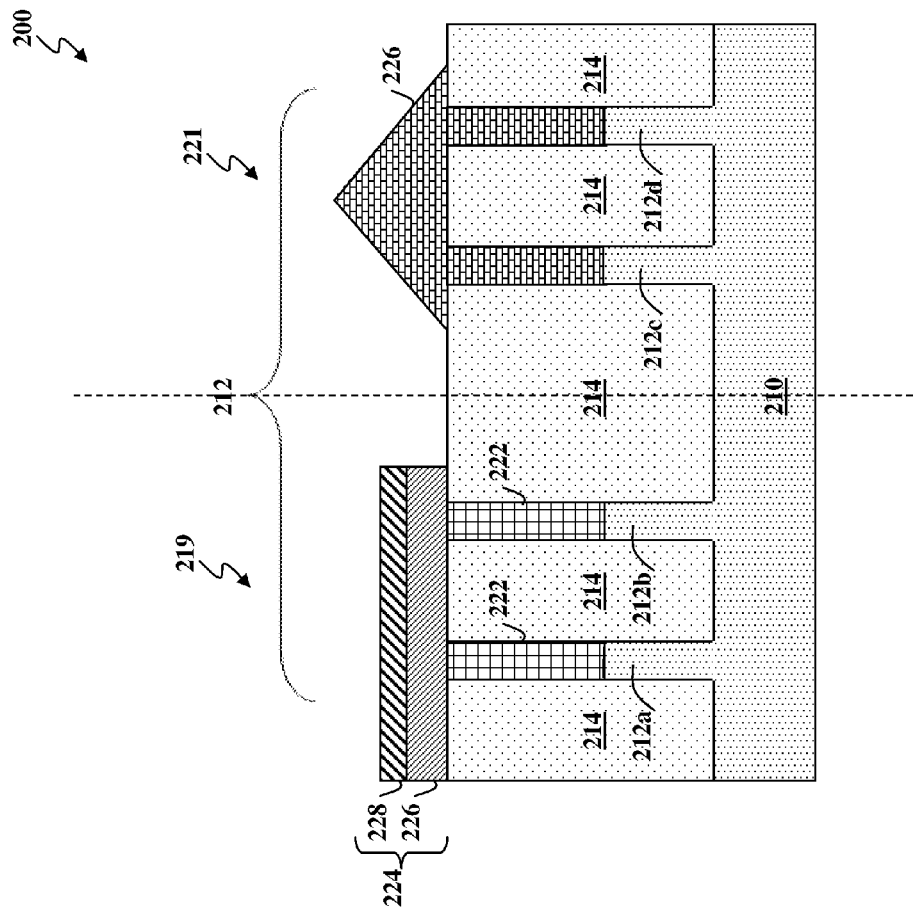

Referring to FIG. 11, a portion of the second hardmask 224 is patterned such that it protects the first region 219 of the substrate 210 and exposes the second region 221 of the substrate 210. The second hardmask 224 may be patterned by any suitable process such as a photolithography process and an etching process. For example, after forming the second hardmask 224 a photoresist layer is deposited over the second hardmask 224. Thereafter, the photoresist layer is exposed to a pattern, a post-exposure bake process is performed, and the photoresist layer is developed to form a pattern. In some embodiments, the photoresist layer patterning includes processing steps of photoresist coating, soft baking, mask aligning, exposing pattern, post-exposure baking, developing photoresist, and hard baking. After the photoresist pattern is formed, an etching process is used to remove portions of the second hardmask 224 such that the remaining portion of the second hardmask 224 only covers the first region 219 of the substrate 210 and exposes the second region 221 of the substrate 210. Exposing the second region 221 of the substrate 210 includes exposing a top surface of the fins 212c and 212d.

Still referring to FIG. 11, a germanium (Ge) material 226 is epi grown over the exposed surface of fins 212c and 212d, in the second region 221 of the substrate 210. The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition (e.g., silicon) of the fin structure 212.

Figure 12:
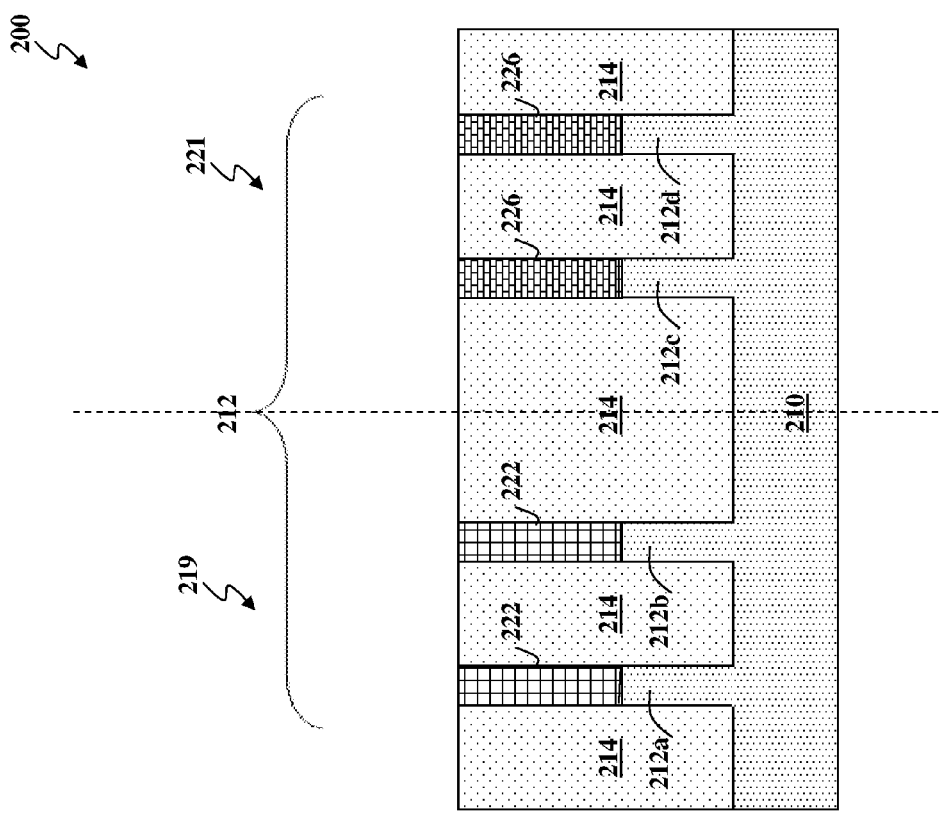

Referring to FIG. 12, a planarizing process is performed on the CMOS FinFET device 200. In the present embodiment, the planarizing process includes a chemical mechanical polishing (CMP) process applied to remove excessive portions of Ge material 226 and to remove the second hardmask 224. The planarizing process can be performed such that a top surface of the III-V material 222 of the fins 212a and 212b (of the fin structure 212) are in the same plane as a top surface of the Ge material 226 of the fins 212c and 212d, (of the fin structure 212).

Figure 13:
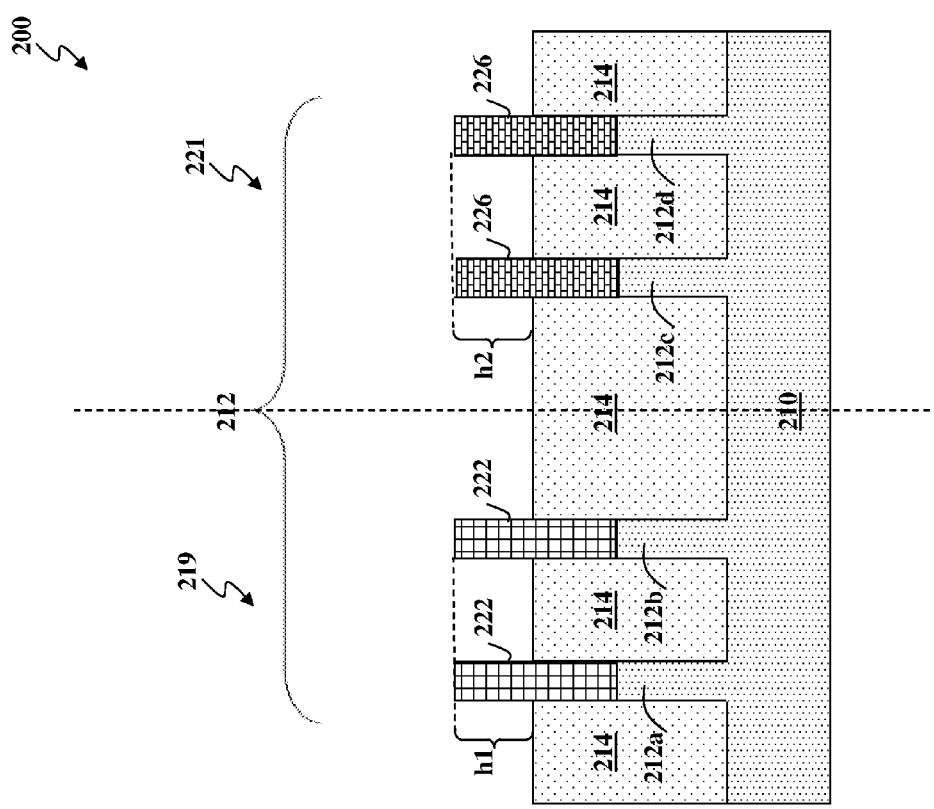

Referring to FIG. 13, an etching process is used to etch-back the insulation material 214 between each fin 212a-212d of the fin structure 212 to expose a first and second sidewall of each fin 212a-212d of the fin structure 212. The first region 219 of the substrate 210 includes fins 212a and 212b comprising a III-V material and having a height h1. The height h1 is measured from a top surface of each fin 212a and 212b and the top surface of the insulation material 214. The second region 221 of the substrate 210 includes fins 212c and 212d comprising a Ge material having a height h2. The height h2 is measured from a top surface of each fin 212c and 212d and the top surface of the insulation material 214. The height h1 is substantially the same as the height h2. In some embodiments, the etching process includes wet etching, a dry etching process, or a combination thereof. In another example, a dry etching process includes forming a photoresist layer, patterning the photoresist layer, etching the insulation material 212, and removing the photoresist layer. In furtherance of the example, the dry etching process used to etch the insulation material includes a chemistry including fluorine-containing gas. In furtherance of the example, the chemistry of the dry etch includes CF4, SF6, or NF3.

Figure 14:
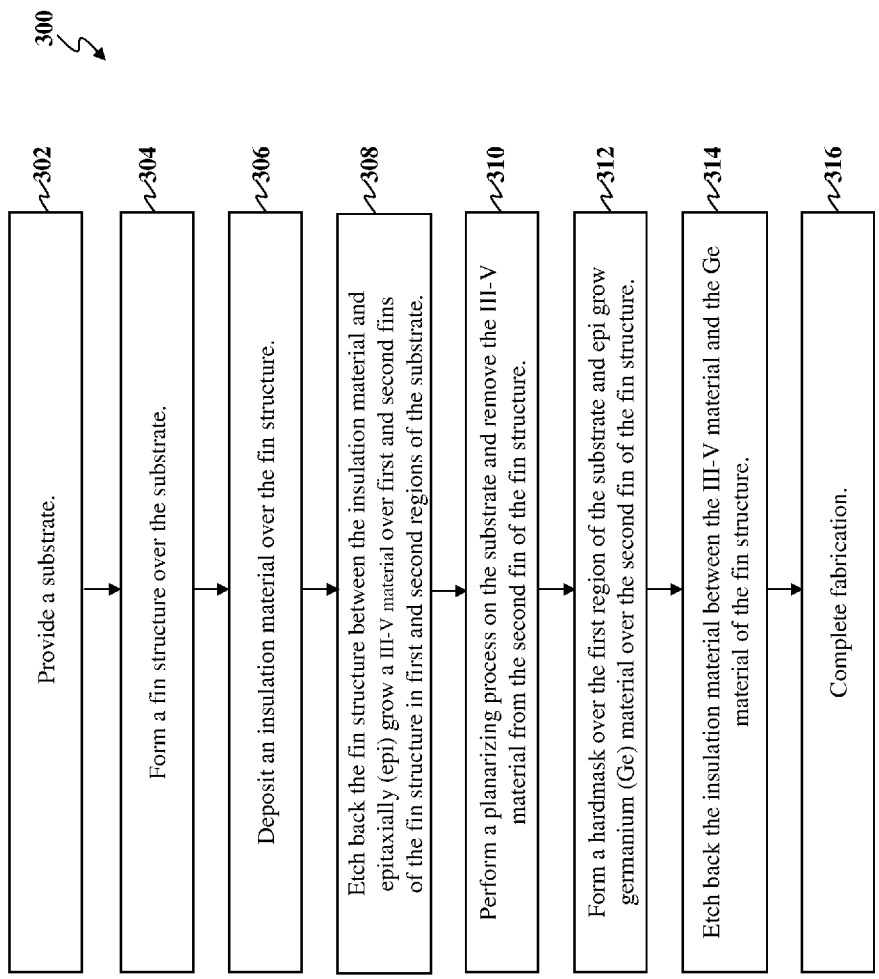
FIG. 14 is a flowchart illustrating a method of fabricating a semiconductor device according to various aspects of the present disclosure.

Referring to FIG. 14, a method 300 for fabricating a semiconductor device is described according to various aspects of the present disclosure. The embodiment of method 300 may include similar process steps as an embodiment of the method 100 which is disclosed above. In disclosing the embodiment of method 300, some details regarding processing and/or structure may be skipped for simplicity if they are similar to those described in the embodiment of method 100.

In the present embodiment, the method 300 is for fabricating an integrated circuit device that includes a complementary metal-oxide-semiconductor (CMOS) fin-like field effect transistor (FinFET) device. The method 300 begins at block 302 where a substrate including first and second regions is provided. At block 304, a fin structure is formed over the substrate. The formation of the fin structure may include patterning a mask layer and etching the semiconductor substrate using the mask layer. At block 306, an insulation material is deposited over the fin structure. The insulation material may be deposited such that it covers the fin structure. A planarizing process may be performed such that the top surface of the insulation material is planarized, exposing the top portion of the fin structure. The method continues with block 308 where the fin structure is etched back between the insulation material and a type III-V material is epitaxially (epi) grown over a first fin of the fin structure in the first region of the substrate and over a second fin of the fin structure in the second region of the substrate. At block 310, a planarizing process is performed and the type III-V material is removed from the second region of the substrate. At block 312, a hardmask is formed over the first region of the substrate and a germanium (Ge) material is epi grown over the second fin of the fin structure in the second region. After epi growing the Ge material, a planarizing process may be performed such that the top surface of the substrate is planarized. It is understood that, alternatively, the method 300 may be implanted by epi growing Ge material over the first and second fins in the first and second regions and thereafter forming a hardmask over the second region, removing the Ge material from the first region, and then epi growing the III-V material over the first fin in the first region. At block 314, the insulation material is etched back between the III-V material and the Ge material of the fin structure. The method 300 continues with block 316 where fabrication of the integrated circuit device is completed.

Completing the fabrication process may include, among other things, forming a gate stack over a channel region of the fin structure and forming source and drain (S/D) feature in a S/D region of the semiconductor device. Forming the gate stack may be a gate first or a gate last process. For example, in a gate first process, forming the gate stack may include depositing a dielectric layer over the fin structure in the central region, forming a gate structure (e.g., gate electrode) over the dielectric layer, and forming gate spacers on the walls of the gate structure and adjacent to the S/D region of the semiconductor device. Thereafter, a S/D feature may be formed in the S/D region by recessing the semiconductor material in the S/D region and depositing a doped semiconductor material in the S/D region. The deposition of the doped semiconductor material may include epi growing the semiconductor material. Additional steps can be provided before, during, and after the method 300, and some of the steps described can be replaced or eliminated for other embodiments of the method. The discussion that follows illustrates various embodiments of a semiconductor device that can be fabricated according to the method 300 of FIG. 14.

FIGS. 15-21 illustrate diagrammatic cross-sectional side views of one embodiment of a semiconductor device at various stages of fabrication, according to the method of FIG. 14. The semiconductor device 400 of FIGS. 15-21 is similar in certain respects to the semiconductor device 200 of FIGS. 2-13. Accordingly, similar features in FIGS. 2-13 and FIGS. 15-21 are identified by the same reference numerals for clarity and simplicity. In the present disclosure, the semiconductor device is a CMOS FinFET device 400. The CMOS FinFET device 400 includes a NMOS FinFET device and a PMOS FinFET device. The CMOS FinFET device 400 may be included in a microprocessor, memory cell, and/or other integrated circuit device. FIGS. 15-21 have been simplified for the sake of clarity to better understand the inventive concepts of the present disclosure. Additional features can be added in the CMOS FinFET device 400, and some of the features described below can be replaced or eliminated in other embodiments of the CMOS FinFET device 400.

Figure 15:
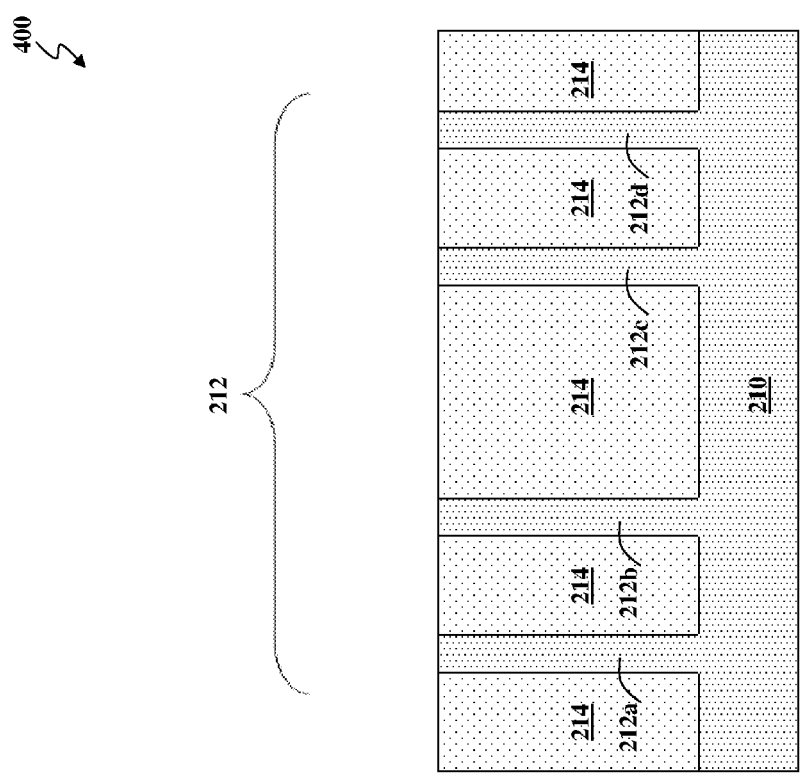
FIGS. 15-21 illustrate diagrammatic cross-sectional side views of one embodiment of a semiconductor device at various stages of fabrication, according to the method of FIG. 14.

Referring to FIG. 15, the CMOS FinFET device 400 includes a substrate (e.g., wafer) 210. In the present embodiment, the substrate 210 defined in the CMOS FinFET device 400 is substantially similar to the substrate 210 of the CMOS FinFET device 200 in terms of composition, formation and configuration. In an alternative embodiment, they are different. The CMOS FinFET device 400 further includes a fin structure 212 (including a plurality of fins 212a-212d) which is formed by any suitable process. In the present embodiment, the fin structure 212 defined in the CMOS FinFET device 400 is substantially similar to the fin structure 212 of the CMOS FinFET device 200 in terms of composition, formation and configuration. In an alternative embodiment, they are different. The CMOS FinFET device 400 further includes an insulation material 214. In the present embodiment, the insulation material 214 defined in the CMOS FinFET device 400 is substantially similar to the insulation material 214 of the CMOS FinFET device 200 in terms of composition, formation and configuration. In an alternative embodiment, they are different.

Figure 16:
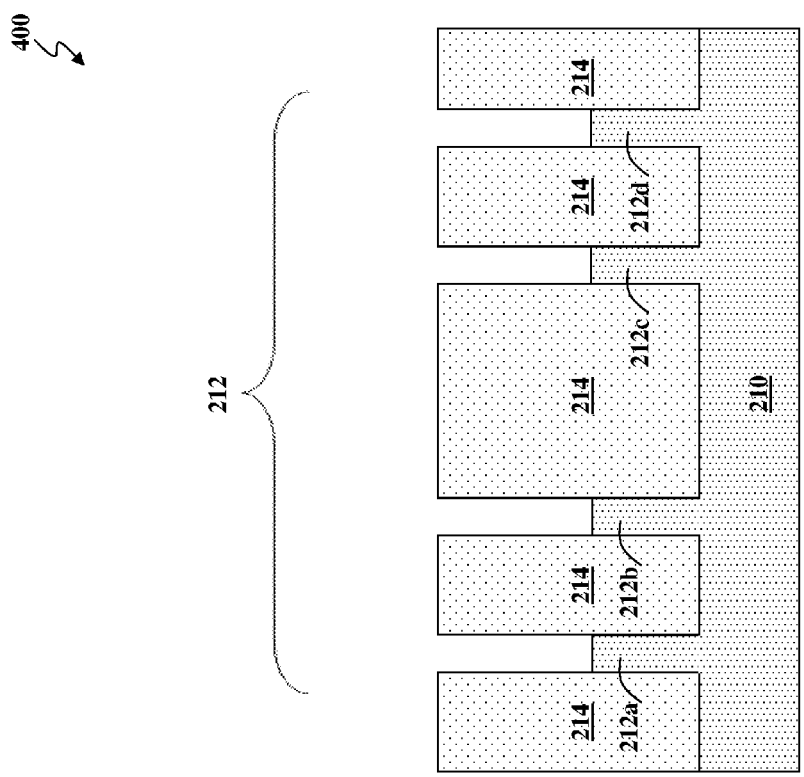

Referring to FIG. 16, an etching process is used to etch-back the material of the fin structure 212 in between the insulation material 214 thereby forming a plurality of trenches corresponding to the fins 212a-212d, of the fin structure 212. The plurality of trenches have sidewalls defined by the surrounding insulation material 214 and a bottom surface, opposing the opening, being defined by the top surface of the underlying fin (e.g., fin 212a-212d) of the fin structure 212. The etching process that is used to etch-back the material of the fin structure 212 may include a wet etching, a dry etching process, or a combination thereof. In one example, a dry etching process may include forming a photoresist layer, patterning the photoresist layer, etching each fin 212a-212d of the fin structure 212, and removing the photoresist layer. In furtherance of the example, the dry etching process used to etch the fin material may include a chemistry including fluorine-containing gas.

Figure 17:
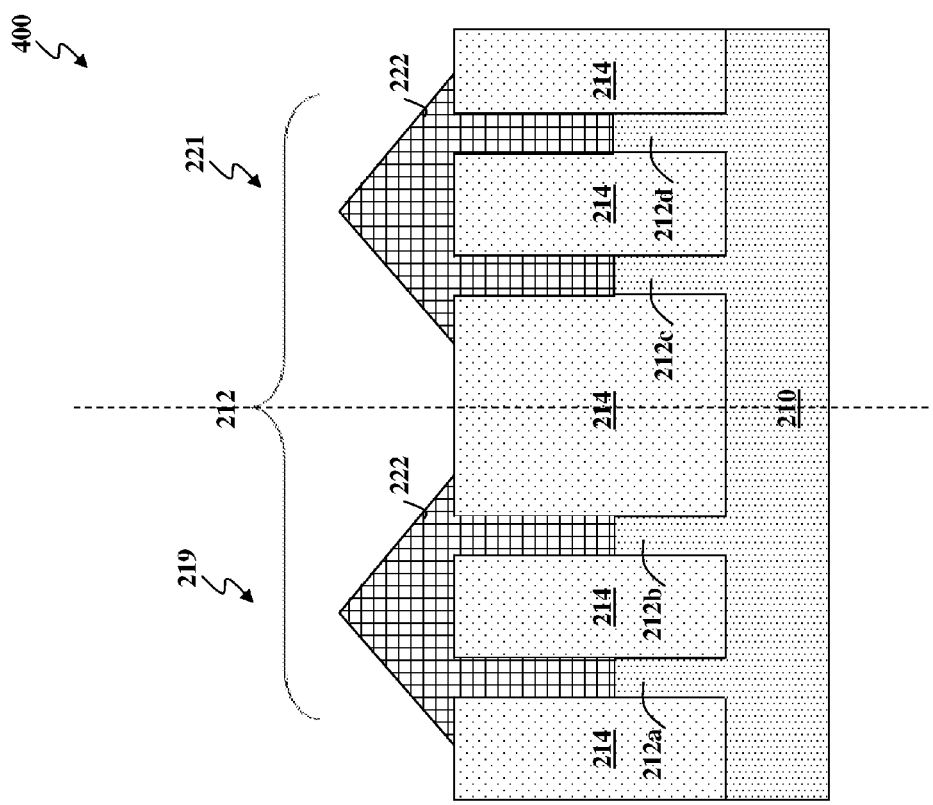

Referring to FIG. 17, a III-V material 222 is epi grown over a first region 219 and a second region 221 of the substrate 210. The first region 219 includes fins (e.g., 212a and 212b) of the fin structure 212 and second region 221 includes fins (e.g., 212c and 212d) of the fin structure 212. In the present embodiment, the first region 219 defines a NMOS region and the second region 221 defines a PMOS region of the CMOS FinFET device 400. In the present embodiment, the III-V material 222 includes a type III-V material such as InAs, InGaAs, InGaSb, InP, AlSb, and the like formed by an epitaxy process. The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition (e.g., silicon) of the fin structure 212.

Figure 18:
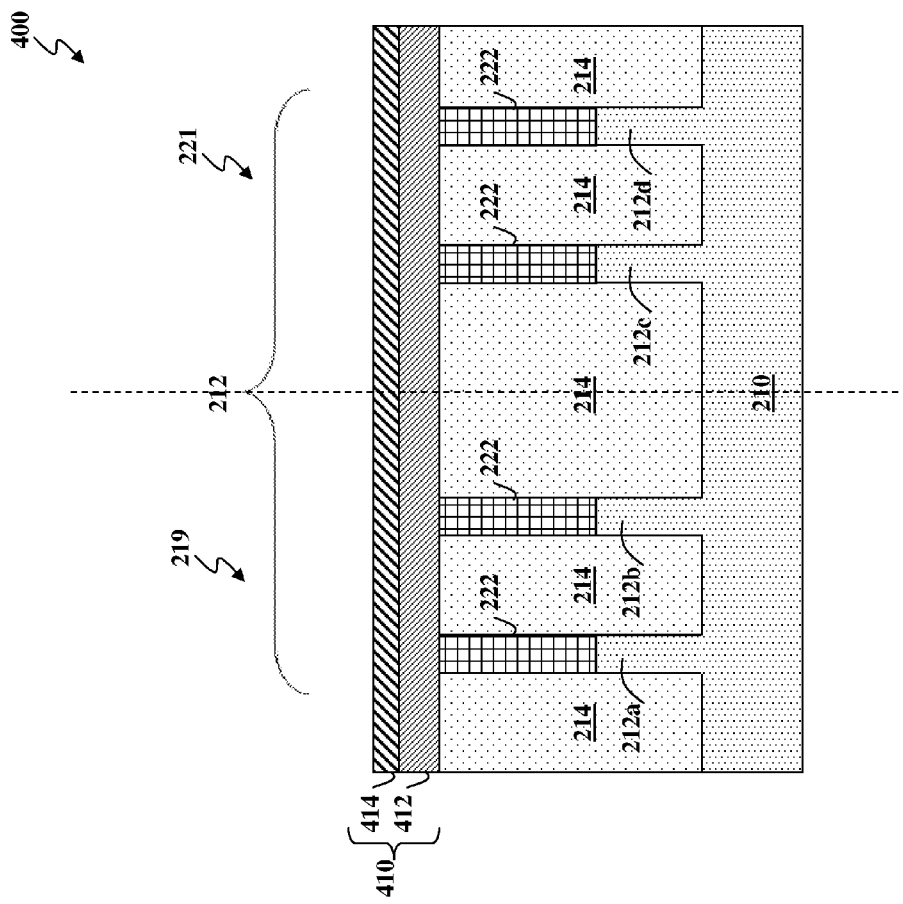

Referring to FIG. 18, a planarizing process is performed on the CMOS FinFET device 400. In the present embodiment, the planarizing process includes a chemical mechanical polishing (CMP) process applied to the first region 219 and the second region 221 of the CMOS FinFET device 400 to remove excessive portions of the III-V material 222. The planarizing process may be performed such that a top surface of the III-V material 222 of the fins 212a and 212b (of the fin structure 212) are in the same plane as a top surface of the III-V material 222 of the fins 212c and 212d (of the fin structure 212).

Still referring to FIG. 18, a hardmask 410 is formed over the substrate 210. Forming the hardmask 410 may include depositing an oxide layer 412 and a nitride layer 414 over the fin structure 212. The hardmask 410 is formed by any suitable process to any suitable thickness. In the present embodiment, the hardmask 410 is formed by a CVD process. In various examples, the hardmask 410 can be formed by physical vapor deposition (PVD), atomic layer deposition (ALD), high density plasma CVD (HDPCVD), other suitable methods, and/or combinations thereof. The CVD process, for example, may use chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6).

Figure 19:
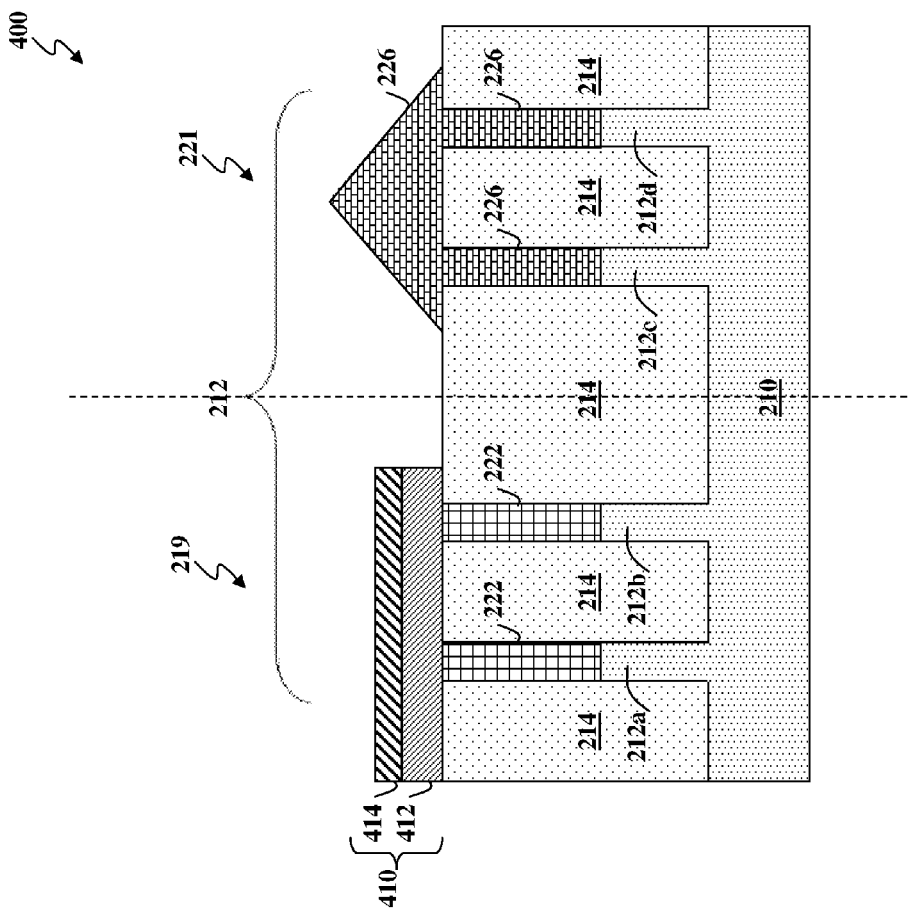

Referring to FIG. 19, a portion of the hardmask 410 is patterned such that it protects the first region 219 of the substrate 210 and exposes the second region 221 of the substrate 210. The hardmask 410 may be patterned by any suitable process such as a photolithography process and an etching process. For example, after forming the second hardmask 224 a photoresist layer is deposited over the second hardmask 224. Thereafter, the photoresist layer is exposed to a pattern, a post-exposure bake process is performed, and the photoresist layer is developed to form a pattern. The photoresist layer patterning may include processing steps of photoresist coating, soft baking, mask aligning, exposing pattern, post-exposure baking, developing photoresist, and hard baking. After the photoresist pattern is formed, an etching process may be used to remove portions of the hardmask 410 such that the hardmask 410 only covers the first portion of the fin structure 212. The etching process may include a wet etching, a dry etching process, or a combination thereof.

After the second region 221 is exposed by patterning the hardmask 410, the III-V material 222 is removed from the second region 221 thereby exposing top surfaces of fins 212c and 212d, of the fin structure 212. Removing the III-V material 222 from the second region 221 may include a wet etching, a dry etching, or a combination thereof.

Still referring to FIG. 19, a germanium (Ge) material 226 is epi grown over the exposed top surface of fins 212c and 212d, in the second region 221 of the substrate 210. The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition (e.g., silicon) of the fin structure 212.

Figure 20:
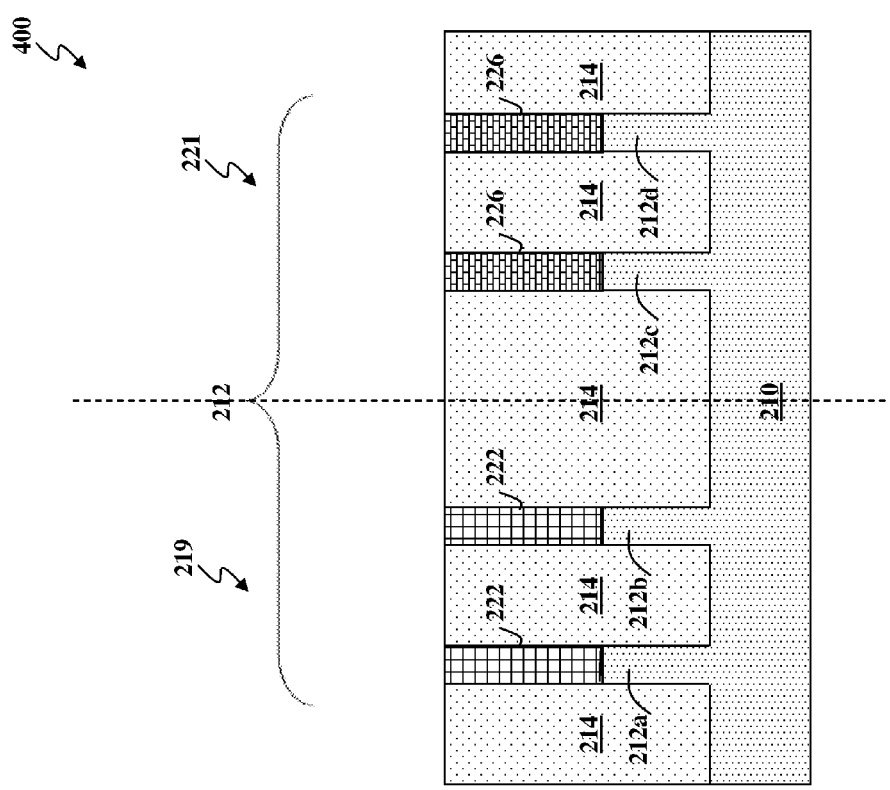

Referring to FIG. 20, a planarizing process is performed on the CMOS FinFET device 400. In the present embodiment, the planarizing process includes a chemical mechanical polishing (CMP) process applied to remove the hardmask 410 and to remove excessive portions of the Ge material. The planarizing process may be performed such that a top surface of the III-V material 222 of the fins 212a and 212b of the fin structure 212 are in the same plane as a top surface of the Ge material 226 of the fins 212c and 212d, of the fin structure 212.

Figure 21:
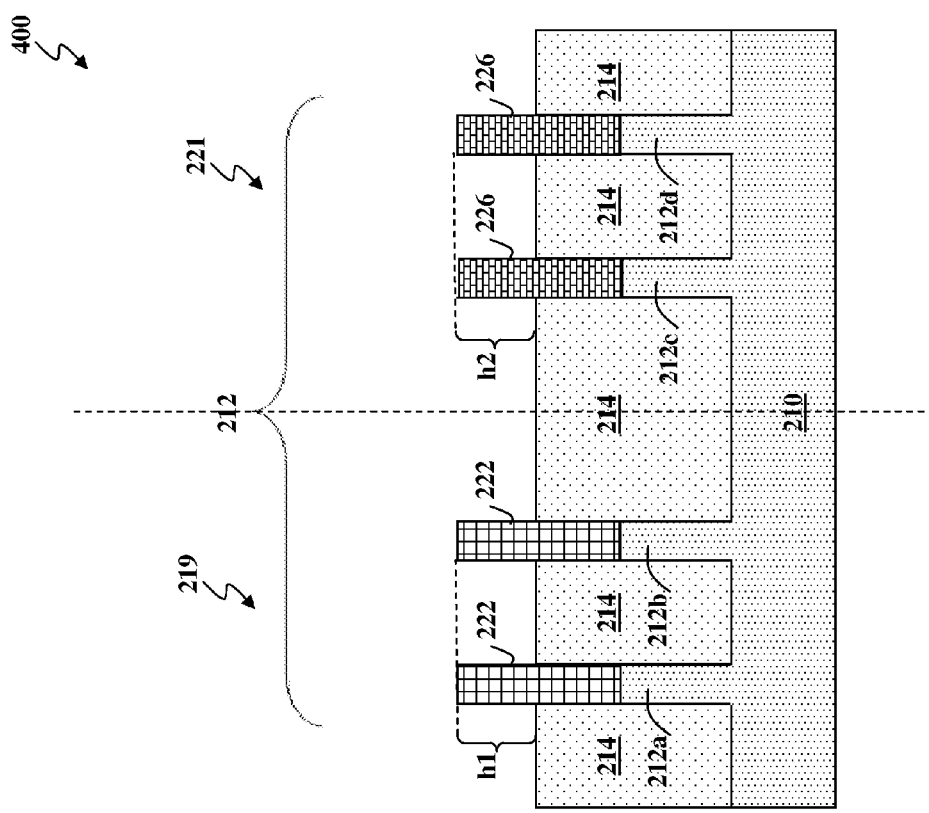

Referring to FIG. 21, an etching process is used to etchback the insulation material 214 between each fin 212a-212d of the fin structure 212 to expose first and second sidewalls of each fin 212a-212d of the fin structure 212. The first region 219 of the substrate 210 includes fins 212a and 212b comprising a III-V material and having a height h1. The height h1 being measured from a top surface of each fin 212a and 212b and the top surface of the insulation material 214. The second region 221 of the substrate 210 includes fins 212c and 212d comprising a Ge material having a height h2. The height h2 being measured from a top surface of each fin 212c and 212d and the top surface of the insulation material 214. The height h1 is substantially the same as the height h2. The etching process may include a wet etching, a dry etching process, or a combination thereof. In one example, a dry etching process may include forming a photoresist layer, patterning the photoresist layer, etching the insulation material 212, and removing the photoresist layer. In furtherance of the example, the dry etching process used to etch the insulation material may include a chemistry including fluorine-containing gas. In furtherance of the example, the chemistry of the dry etch includes CF4, SF6, or NF3.

Figure 22:
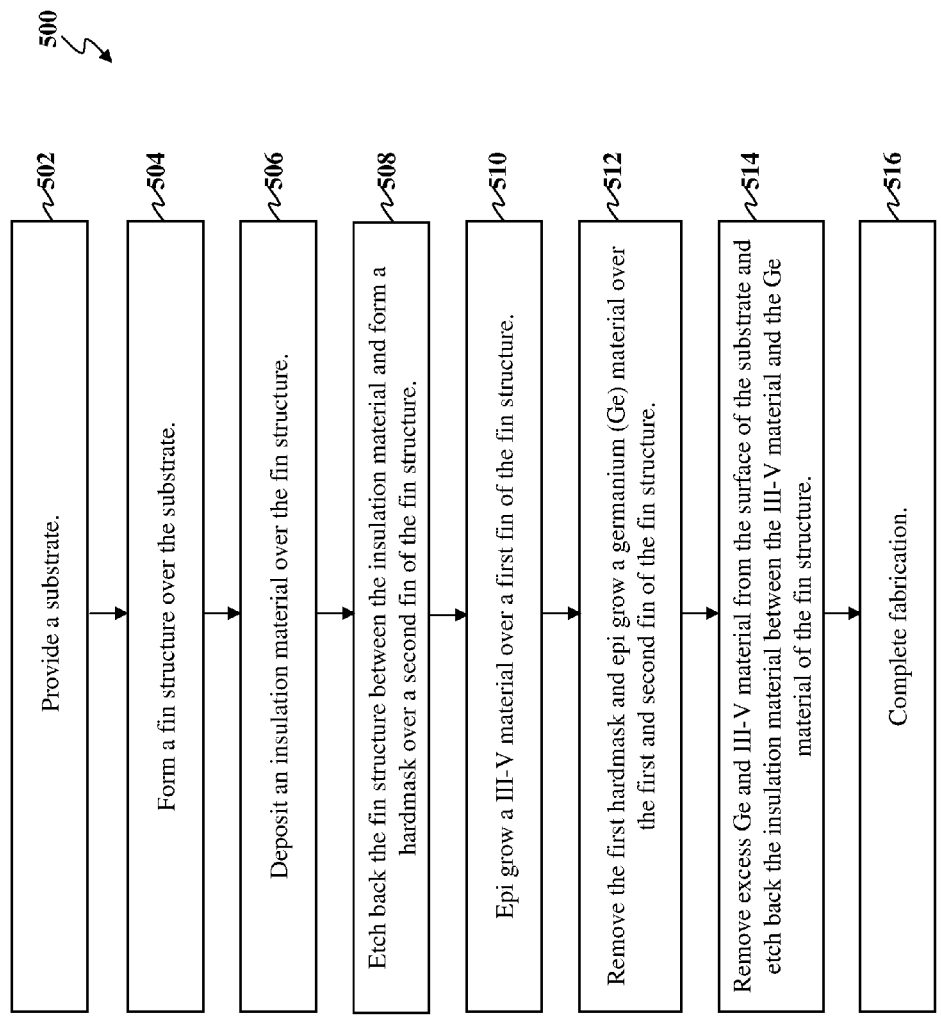
FIG. 22 is a flowchart illustrating a method of fabricating a semiconductor device according to various aspects of the present disclosure.

Referring to FIG. 22, a method 500 for fabricating a semiconductor device is described according to various aspects of the present disclosure. The embodiment of method 500 may include similar process steps as an embodiment of the method 100 which is disclosed above. In disclosing the embodiment of method 500, some details regarding processing and/or structure may be skipped for simplicity if they are similar to those described in the embodiment of method 100.

In the present embodiment, the method 500 is for fabricating an integrated circuit device that includes a complementary metal-oxide-semiconductor (CMOS) fin-like field effect transistor (FinFET) device. The method 500 begins at block 502 where a substrate including first and second regions is provided. At block 504, a fin structure is formed over the substrate. The formation of the fin structure may include patterning a mask layer and etching the semiconductor substrate using the mask layer. At block 506, an insulation material is deposited over the fin structure. The insulation material may be deposited such that it covers the fin structure. A planarizing process may be performed such that the top surface of the insulation material is planarized, exposing the top portion of the fin structure. The method continues with block 508 where the fin structure is etched back between the insulation material and a hardmask is formed over a second fin of the fin structure in the second region of the substrate leaving a first fin of the fin structure in the first region of the substrate exposed. At block 510, a type III-V material is epitaxially (epi) grown over the exposed first fin of the fin structure. At block 512, the hardmask is removed exposing the second fin of the fin structure and a germanium (Ge) material is epi grown over the first and second fins of the fin structure. It is understood that, alternatively, the method 500 may be implemented by forming the hardmask on the first region and epi growing Ge over the exposed second fin of the second region and thereafter removing the hardmask and epi growing the III-V material over the exposed first fin in the first region. At block 514, the excess Ge material and the excess III-V material is removed from the substrate 210 and the insulation material is etched back between the III-V material and the Ge material of the fin structure. The method 500 continues with block 516 where fabrication of the integrated circuit device is completed.

Completing the fabrication process may include, among other things, forming a gate stack over a channel region of the fin structure and forming source and drain (S/D) feature in a S/D region of the semiconductor device. Forming the gate stack may be a gate first or a gate last process. For example, in a gate first process, forming the gate stack may include depositing a dielectric layer over the fin structure in the central region, forming a gate structure (e.g., gate electrode) over the dielectric layer, and forming gate spacers on the walls of the gate structure and adjacent to the S/D region of the semiconductor device. Thereafter, a S/D feature may be formed in the S/D region by recessing the semiconductor material in the S/D region and depositing a doped semiconductor material in the S/D region. The deposition of the doped semiconductor material may include epi growing the semiconductor material. Additional steps can be provided before, during, and after the method 500, and some of the steps described can be replaced or eliminated for other embodiments of the method. The discussion that follows illustrates various embodiments of a semiconductor device that can be fabricated according to the method 500 of FIG. 22.

FIGS. 23-29 illustrate diagrammatic cross-sectional side views of one embodiment of a semiconductor device at various stages of fabrication, according to the method of FIG. 22. The semiconductor device 600 of FIGS. 23-29 is similar in certain respects to the semiconductor device 200 of FIGS. 2-13. Accordingly, similar features in FIGS. 2-13 and FIGS. 23-29 are identified by the same reference numerals for clarity and simplicity. In the present disclosure, the semiconductor device is a CMOS FinFET device 600. The CMOS FinFET device 600 includes a NMOS FinFET device and a PMOS FinFET device. The CMOS FinFET device 600 may be included in a microprocessor, memory cell, and/or other integrated circuit device. FIGS. 23-29 have been simplified for the sake of clarity to better understand the inventive concepts of the present disclosure. Additional features can be added in the CMOS FinFET device 600, and some of the features described below can be replaced or eliminated in other embodiments of the CMOS FinFET device 600.

Figure 23:
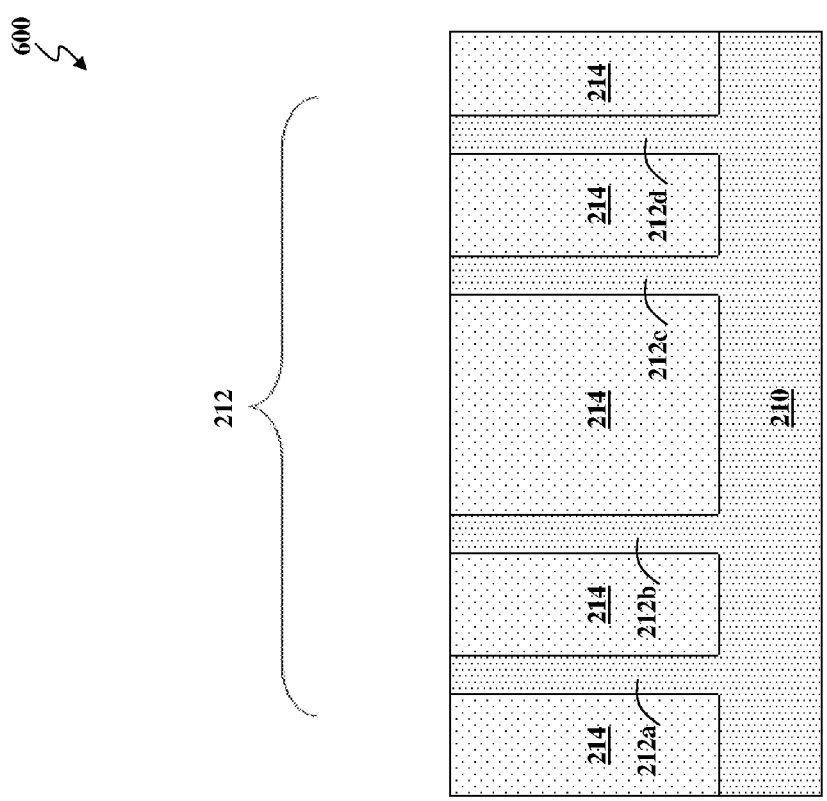
FIGS. 23-29 illustrate diagrammatic cross-sectional side views of one embodiment of a semiconductor device at various stages of fabrication, according to the method of FIG. 22.

Referring to FIG. 23, the CMOS FinFET device 600 includes a substrate (e.g., wafer) 210. In the present embodiment, the substrate 210 defined in the CMOS FinFET device 600 is substantially similar to the substrate 210 of the CMOS FinFET device 200 in terms of composition, formation and configuration. In an alternative embodiment, they are different. The CMOS FinFET device 600 further includes a fin structure 212 (including a plurality of fins 212a-212d) which is formed by any suitable process. In the present embodiment, the fin structure 212 defined in the CMOS FinFET device 600 is substantially similar to the fin structure 212 of the CMOS FinFET device 200 in terms of composition, formation and configuration. In an alternative embodiment, they are different. The CMOS FinFET device 600 further includes an insulation material 214. In the present embodiment, the insulation material 214 defined in the CMOS FinFET device 600 is substantially similar to the insulation material 214 of the CMOS FinFET device 200 in terms of composition, formation and configuration. In an alternative embodiment, they are different.

Figure 24:
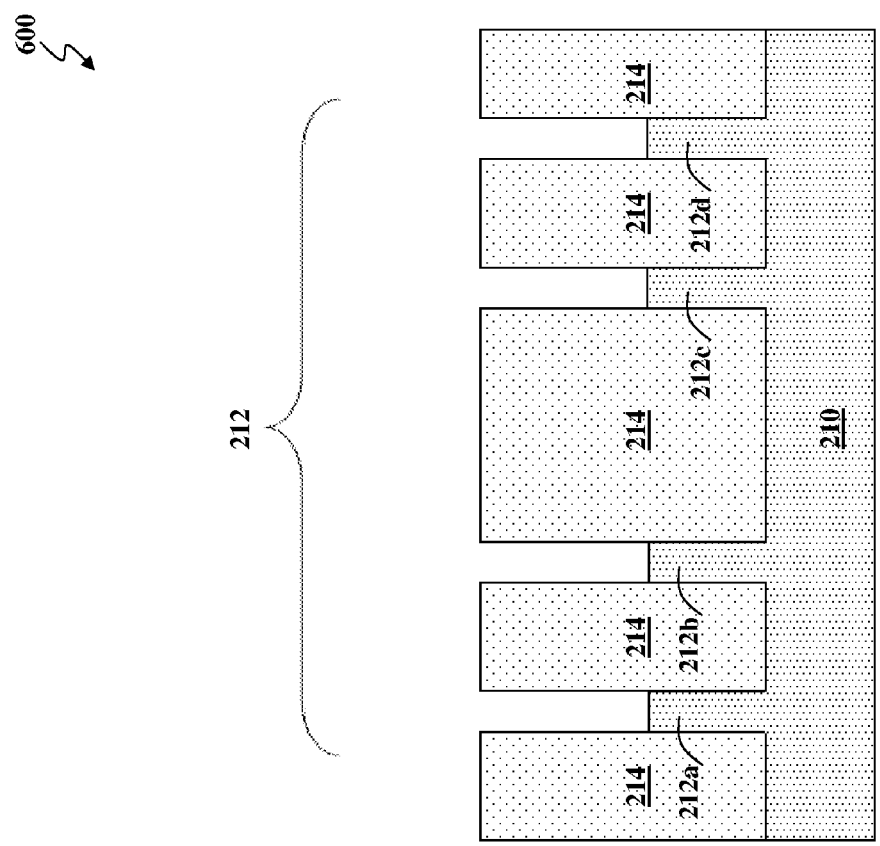

Referring to FIG. 24, an etching process is used to etch-back the material of the fin structure in between the insulation material 214 thereby forming a plurality of trenches corresponding to the fins 212a-212d, of the fin structure 212. The plurality of trenches have sidewalls defined by the surrounding insulation material 214 and a bottom surface, opposing the opening, being defined by the top surface of the underlying fin (e.g., fin 212a-212d) of the fin structure 212. The etching process that is used to etch-back the material of the fin structure 212 may include a wet etching, a dry etching process, or a combination thereof. In one example, a dry etching process may include forming a photoresist layer, patterning the photoresist layer, etching each fin 212a-212d of the fin structure 212, and removing the photoresist layer. In furtherance of the example, the dry etching process used to etch the fin material may include a chemistry including fluorine-containing gas.

Figure 25:
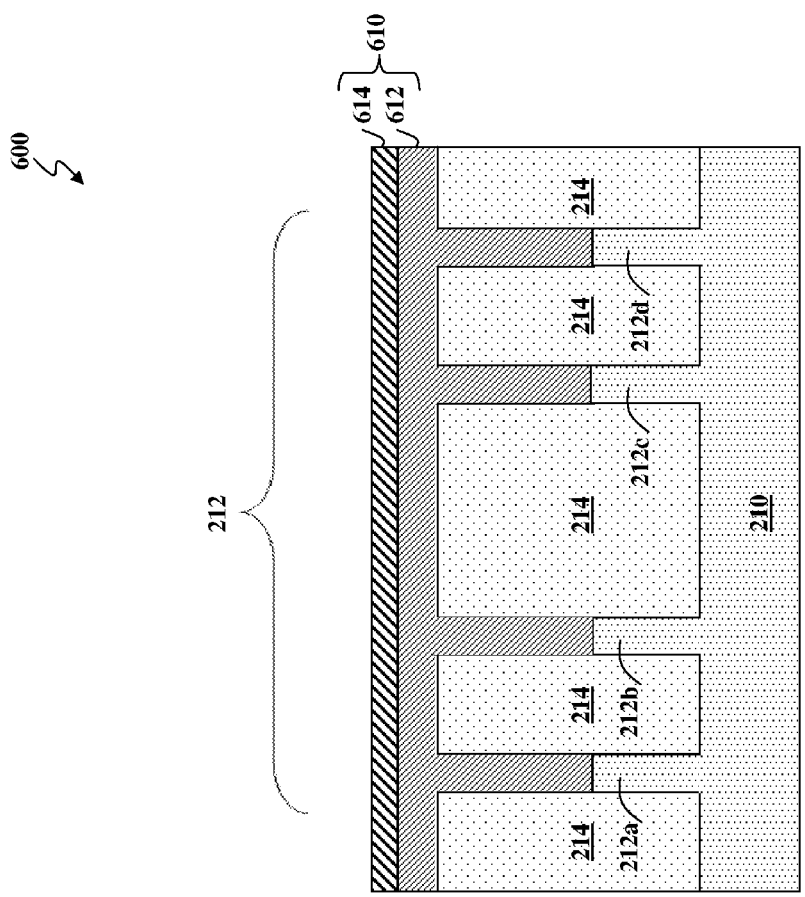

Referring to FIG. 25, a hardmask 610 is formed over the substrate 210. Forming the hardmask 610 includes depositing an oxide layer 612 and a nitride layer 614 over the fin structure 212. The hardmask 610 is formed by any suitable process to any suitable thickness. In the present embodiment, the hardmask 610 is formed by a CVD process. In various examples, the hardmask 610 can be formed by physical vapor deposition (PVD), atomic layer deposition (ALD), high density plasma CVD (HDPCVD), other suitable methods, and/or combinations thereof. The CVD process, for example, may use chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6).

Figure 26:
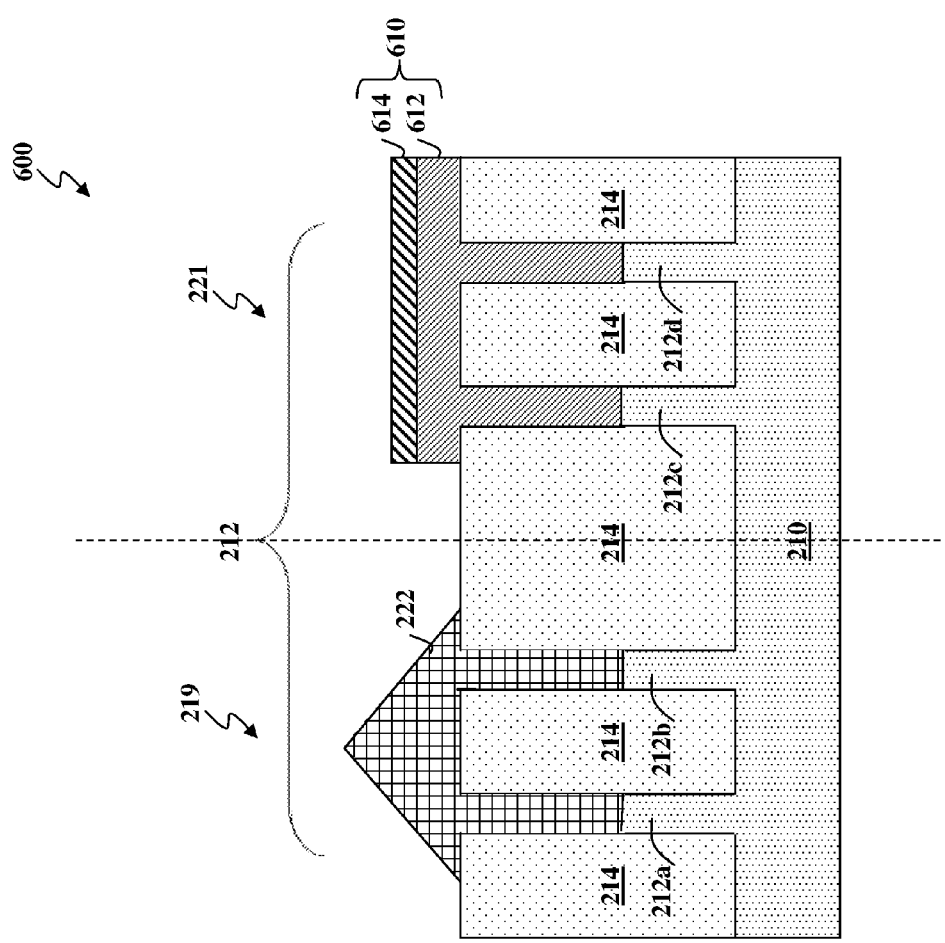

Referring to FIG. 26, a portion of the hardmask 610 is patterned such that it exposes a first region 219 of the substrate 210 and protects a second region 221 of the substrate 210. The first region 219 includes a fins (e.g., 212a and 212b) of the fin structure 212 and the second region 221 includes fins (e.g., 212c and 212d) of the fin structure 212. In the present embodiment, the first region 219 defines a NMOS region of the CMOS FinFET device 200 and the second region 221 defines a PMOS region of the CMOS FinFET device 200. The hardmask 610 may be patterned by any suitable process such as a photolithography process and an etching process. For example, after forming the hardmask 610 a photoresist layer is deposited over the hardmask 610. Thereafter, the photoresist layer is exposed to a pattern, a post-exposure bake process is performed, and the photoresist layer is developed to form a pattern. The photoresist layer patterning may include processing steps of photoresist coating, soft baking, mask aligning, exposing pattern, post-exposure baking, developing photoresist, and hard baking. After the photoresist pattern is formed, an etching process may be used to remove portions of the hardmask 610 such that the hardmask 610 only covers the second region 221 of the substrate 210 thereby exposing the first region 219 of the substrate 210. Exposing the first region 219 of the substrate 210 includes exposing a top surface of the fins 212a and 212b.

Still referring to FIG. 26, a III-V material 222 is epi grown over the exposed surface of the fins 212a and 212b, in the first region 219 of the substrate 210. In the present embodiment, the III-V material 222 includes a type III-V material such as InAs, InGaAs, InGaSb, InP, AlSb, and the like formed by an epitaxy process. The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition (e.g., silicon) of the fin structure 212.

Figure 27:
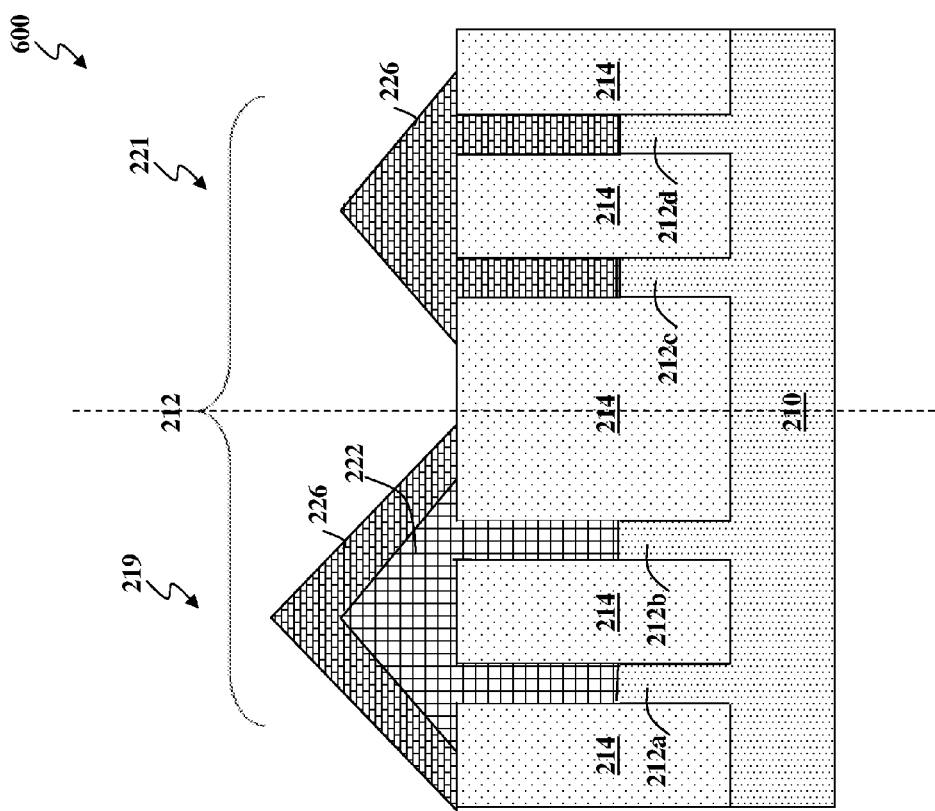

Referring to FIG. 27, a the hardmask 610 is removed thereby exposing the second region 221 of the substrate 210. Exposing the second region 221 of the substrate 210 includes exposing a top surface of the fins 212c and 212d. The hardmask 610 may be removed by any suitable process such as an etching process. The etching process may include a wet etching, a dry etching process, or a combination thereof.

Still referring to FIG. 27, a germanium (Ge) material 226 is epi grown over the exposed top surface of fins 212c and 212d, in the second region 221 of the substrate 210 and the III-V material in the first region 219 of the substrate 210. The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition (e.g., silicon) of the fin structure 212 and the III-V material.

Figure 28:
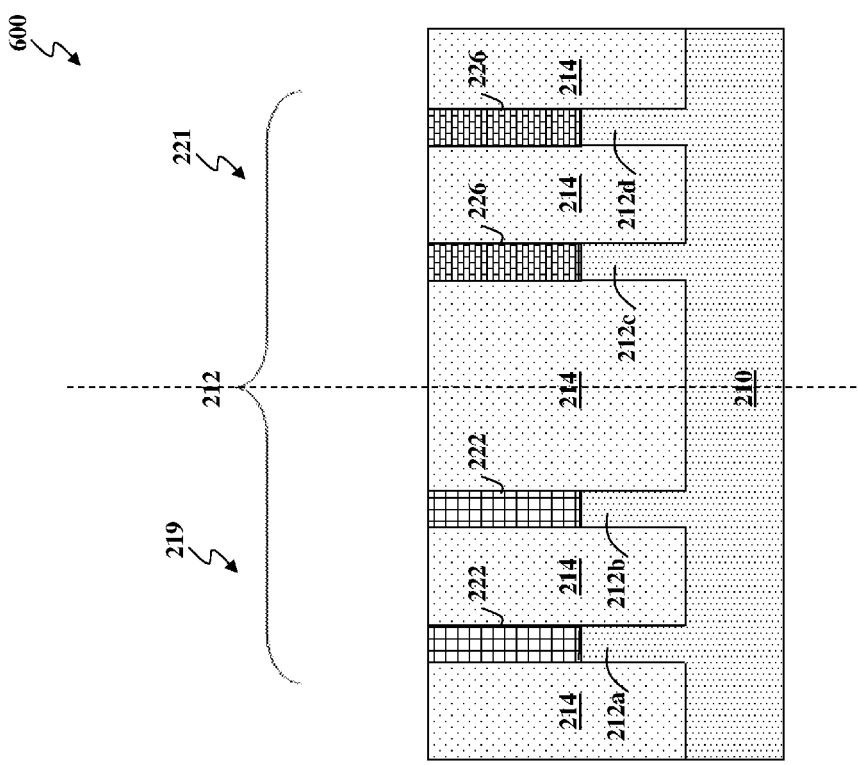

Referring to FIG. 28, a planarizing process is performed on the CMOS FinFET device 600. In the present embodiment, the planarizing process includes a chemical mechanical polishing (CMP) process applied to remove excessive portions of the Ge material 226 and excessive portions of the III-V material 222. The planarizing process may be performed such that a top surface of the III-V material 222 of the fins 212a and 212b of the fin structure 212 are in the same plane as a top surface of the Ge material 226 of the fins 212c and 212d, of the fin structure 212.

Figure 29:
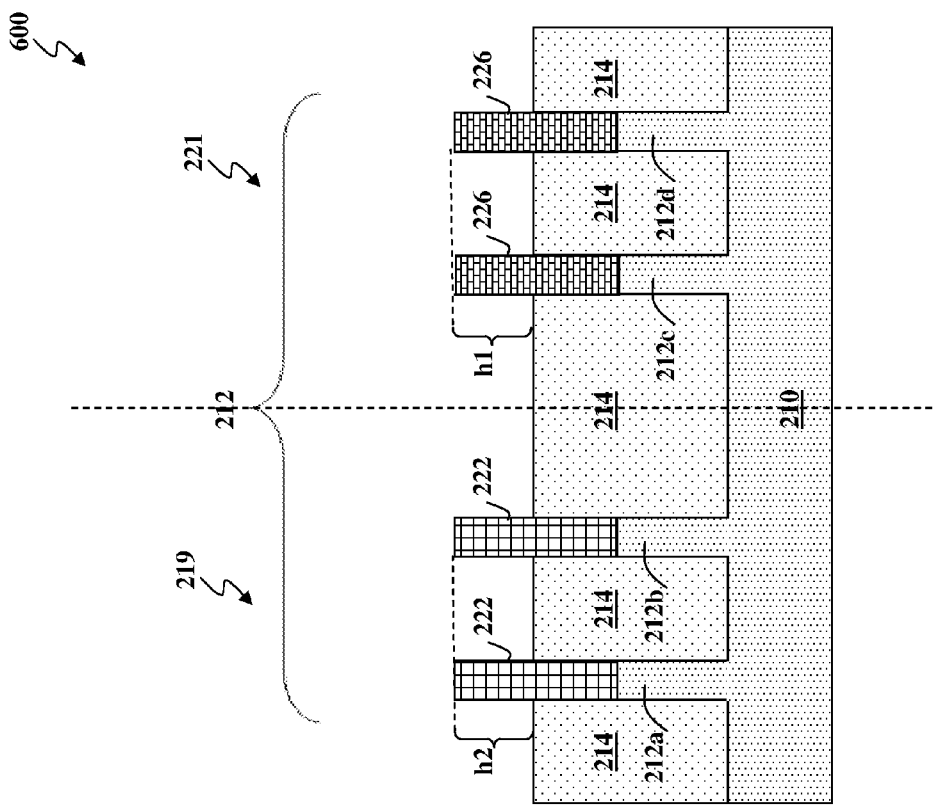

Referring to FIG. 29, an etching process is used to etchback the insulation material 214 between each fin 212a-212d of the fin structure 212 to expose a first and second sidewall of each fin 212a-212d of the fin structure 212. The first region 219 of the substrate 210 includes fins 212a and 212b comprising a III-V material and having a height h1. The height h1 being measured from a top surface of each fin 212a and 212b and the top surface of the insulation material 214. The second region 221 of the substrate 210 includes fins 212c and 212d comprising a Ge material having a height h2. The height h2 being measured from a top surface of each fin 212c and 212d and the top surface of the insulation material 214. The height h1 is substantially the same as the height h2. The etching process may include a wet etching, a dry etching process, or a combination thereof. In one example, a dry etching process may include forming a photoresist layer, patterning the photoresist layer, etching the insulation material 212, and removing the photoresist layer. In furtherance of the example, the dry etching process used to etch the insulation material may include a chemistry including fluorine-containing gas. In furtherance of the example, the chemistry of the dry etch includes CF4, SF6, or NF3.

Figure 30:
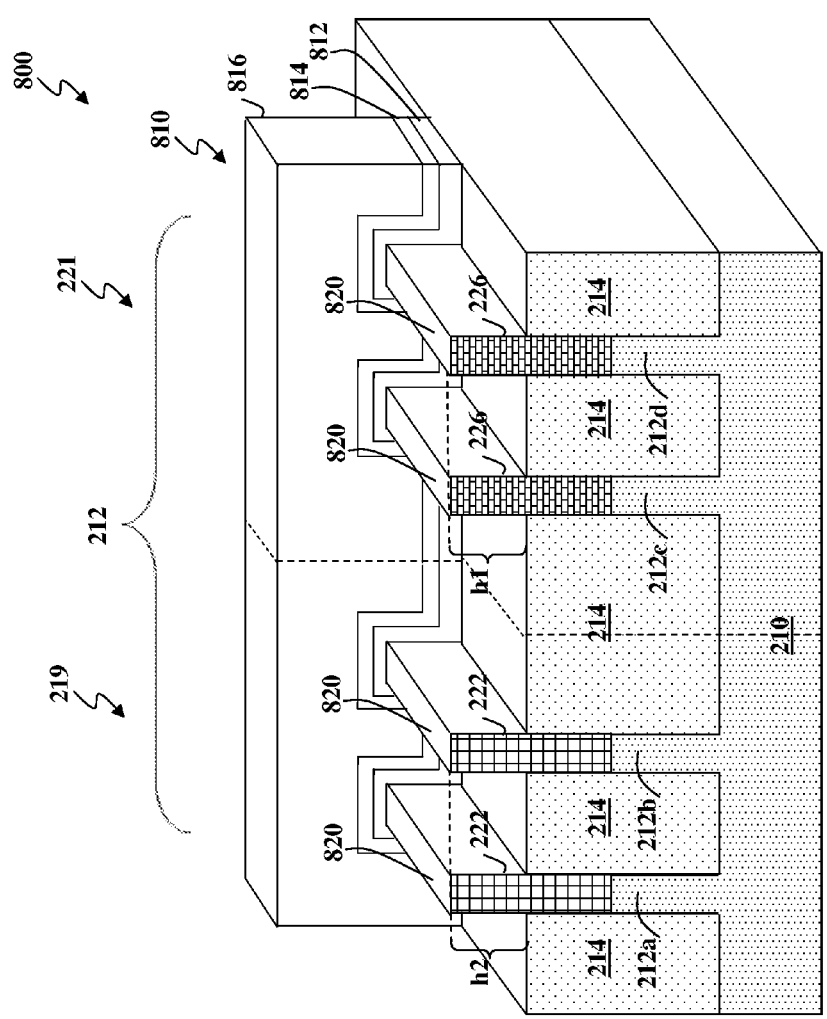
FIGS. 30-31 illustrate perspective views of one embodiment of a semiconductor device at various stages of fabrication, according to various aspects of the present disclosure.
Figure 31:
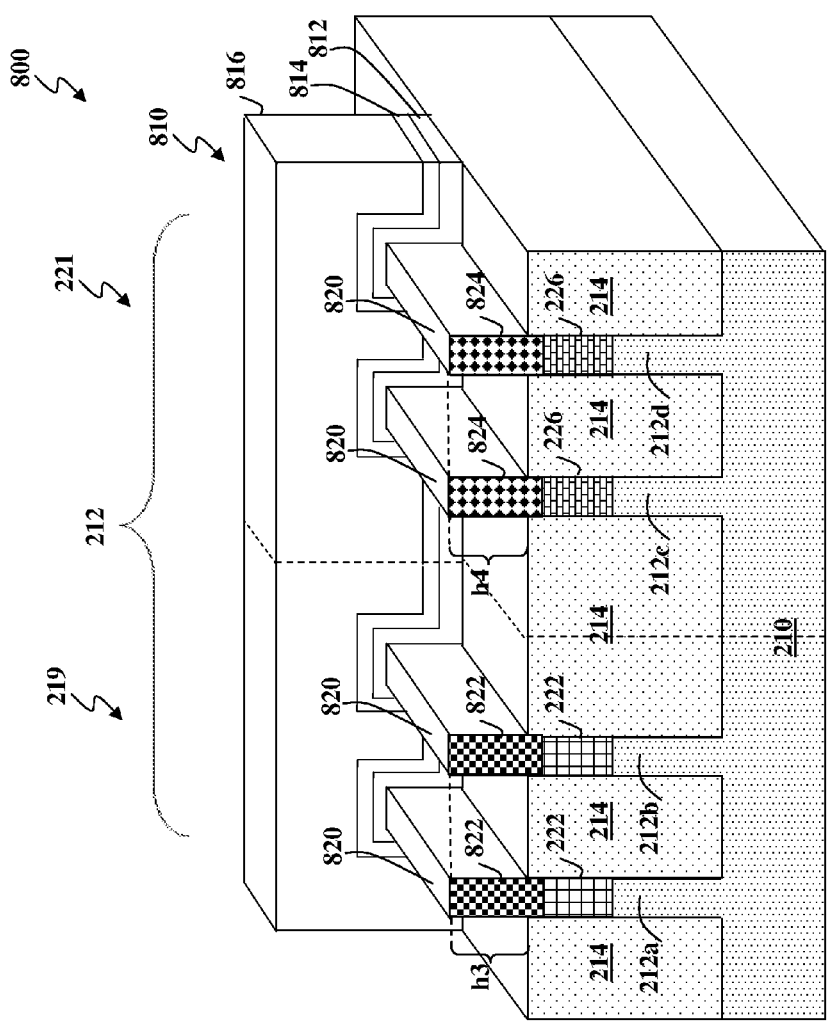

FIGS. 30-31 illustrate perspective views of one embodiment of a semiconductor device at various stages of fabrication, according to various aspects of the present disclosure. The semiconductor device 800 of FIGS. 30-31 is similar in certain respects to the semiconductor device 200, 400, and 600 of FIGS. 2-13, 15-21, and 23-29, respectively. Accordingly, similar features are identified by the same reference numerals for clarity and simplicity. In the present disclosure, the semiconductor device 800 is a CMOS FinFET device 800. The CMOS FinFET device 800 includes a NMOS FinFET device and a PMOS FinFET device. The CMOS FinFET device 800 may be included in a microprocessor, memory cell, and/or other integrated circuit device. FIG. 30 has been simplified for the sake of clarity to better understand the inventive concepts of the present disclosure. Additional features can be added in the CMOS FinFET device 800, and some of the features described below can be replaced or eliminated in other embodiments of the CMOS FinFET device 800.

Referring to FIG. 30, the FinFET device 800 includes a substrate 210 including a first region 219 and a second region 221, a fin structure 212 including a plurality of fins 212a-212d, an insulating material 214 disposed between each fin 212a-212d, of the fin structure 212. The first region 219 includes a NMOS FinFET device and the second region 221 includes a PMOS FinFET device. Each fin in the first region 219 (e.g., 212a and 212b of the fin structure 212) includes a III-V material and each fin in the second region 221 (e.g., 212c and 212d of the fin structure 212) includes a Ge material. The fins in the first region 219 have a height h1 and the fins in the second region 221 have a height h2. The height h1 is substantially the same as the height h2. Formed over each fin 212a-212d of the fin structure 212 is gate structure 810. For each fin 212a-212d, of the fin structure 212, the gate structure 810 separates source/drain (S/D) regions 820 of the CMOS FinFET device 800. For each fin 212a-212d, of the fin structure 212, a channel region is defined between the S/D regions 820 and underlies the gate structure 810. Notably, in such embodiments, all of the S/D regions 820 of the NMOS device include a III-V material and all of the S/D regions 820 of the PMOS device include a Ge material. Further, all of the respective channel regions include a material that is the same as the respective S/D regions. In other words, all of the channel regions of the NMOS device include a III-V material and all of the channel regions of the PMOS device include a Ge material.

Still referring to FIG. 30, the gate structure 810 traverses the fin structure 212, and in the depicted embodiment, is formed on a central portion of the fin structure 212. The gate structure 810 may include a gate dielectric layer 812, a gate electrode 814, and gate spacers. The gate dielectric layer 812 includes a dielectric material, such as silicon oxide, high-k dielectric material, other suitable dielectric material, or combinations thereof. Examples of high-k dielectric material include HfO2, HfSiO, HfSiON, HfTaO, HfTiO, HfZrO, zirconium oxide, aluminum oxide, hafnium dioxide-alumina (HfO2-Al2O3) alloy, other suitable high-k dielectric materials, and/or combinations thereof. The gate electrode 814 includes polysilicon and/or a metal including Al, Cu, Ti, Ta, W, Mo, TaN, NiSi, CoSi, TiN, WN, TiAl, TiAlN, TaCN, TaC, TaSiN, other conductive materials, or combinations thereof. The gate electrode may be formed in a gate first or gate last process. The gate structure 810 may include numerous other layers, for example, capping layers, interface layers, diffusion layers, barrier layers, or combinations thereof. A hardmask layer may be formed over the gate structure 810. The hardmask layer may include silicon oxide, silicon nitride, silicon oxynitride, silicon carbide, other suitable material, or combinations thereof.

The gate structure 810 is formed by a suitable process, including deposition, lithography patterning, and etching processes. The deposition processes include chemical vapor deposition (CVD), physical vapor deposition (PVD), atomic layer deposition (ALD), high density plasma CVD (HD-PCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, and ion-beam writing. In yet another alternative, the lithography patterning process could implement nanoimprint technology. The etching processes includes dry etching, wet etching, and/or other etching methods.

Referring to FIG. 31, in further embodiments, the III-V material 222 and the Ge material 226 are recessed in the S/D regions 820 and a first and second doped semiconductor material 822,824, is deposited in the S/D regions 820 over the recessed III-V material 222 and the Ge material 226, respectively. The recessing may include etching back the III-V material 222 and the Ge material 226 such that the top surface of the III-V material 222 and the Ge material 226 is in a plane below the top surface of the insulation material 214. The deposition of the first and second doped semiconductor material 822,824 may include epi growing the first and second doped semiconductor material 822,824 directly over the recessed III-V material 222 and the recessed Ge material 226, respectively, in the S/D regions 820. In certain embodiments, the first and second doped semiconductor material 822,824 is not included in the channel region 820. Epi growing the first and second semiconductor material 822,824 may include selecting the doped semiconductor material such that the performance (e.g., carrier mobility) of the device is increased. For example, for the NMOS FinFET device of the CMOS FinFET device 800, the first doped semiconductor material 822 may include SiC, Ge, SiGe:P, SiAs, SiP. For the PMOS FinFET device of the CMOS FinFET device 800, the second doped semiconductor material 824 may include germanium Ge, InGaAs, GaAsSb, InAs, InP.

As illustrated in FIG. 31, the fin structure 212 is disposed over the substrate 210 and includes fins (e.g., 212a and 212b) in the first region 219 and fins (e.g., 212c and 212d) in the second region 221. Fins 212a and 212b, include a first portion comprising a material that is the same material as the substrate 210, a second portion comprising the III-V material 222 deposited over the first portion, and a third portion comprising the first doped semiconductor material 822 disposed over the second portion. Fins 212c and 212d include a first portion comprising a material that is the same material as the substrate 210, a second portion of the second fin comprising a germanium (Ge) material 226 deposited over the first portion, and a third portion comprising the second doped semiconductor material 824 disposed over the second portion. Further, the gate structure 810 is disposed on a central portion of the fins 212a and 212b including the III-V semiconductor material separating source and drain regions 820 of the NMOS FinFET device of the CMOS FinFET device and also disposed on a central portion of the fins 212c and 212d, including the Ge material separating source and drain regions 820 of the PMOS FinFET device of the CMOS FinFET device. Notably, in such embodiments, where the III-V material 222 and the Ge material 226 are recessed in the S/D regions 820 and a first and second doped semiconductor material 822,824 is deposited, the channel regions retain the original epi grown material (e.g., III-V material or Ge material). In other words, all of the channel regions of the NMOS device include a III-V material and all of the channel regions of the PMOS device include a Ge material.

The CMOS FinFET device 800 may include additional features, which may be formed by subsequent processing. For example, subsequent processing may further form various contacts/vias/lines and multilayer interconnect features (e.g., metal layers and interlayer dielectrics) on the substrate, configured to connect the various features or structures of the CMOS FinFET device. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structures. In another embodiment, tungsten is used to form tungsten plugs in the contact holes.

Although the above methods 100, 300, and 500 increase production complexity and cost by providing for additional steps to deposit separate materials for the NMOS FinFET and the PMOS FinFET devices of the CMOS FinFET device 200, 400, 600, and 800, the intrinsic carrier mobility in the channel region is significantly improved by approximately 4 times (480, Si→1900, Ge cm$^2$/Vs at 300K) and approximately 6 times (1350, Si→8500, GaAs cm$^2$/Vs at 300K, InAs or InSb will have larger mobility than GaAs) when compared with traditional FinFET devices with common materials for the NMOS FinFET and the PMOS FinFET, respectively, which are known by a person skilled in the art. Different embodiments may have different advantages, and no particular advantage is necessarily required of any embodiment.

Thus, provided is a CMOS FinFET device. An exemplary CMOS FinFET device includes a substrate including a first region and a second region. The CMOS FinFET device further includes a fin structure disposed over the substrate including a first fin in the first region and a second fin in the second region and an insulation material disposed on the substrate and between the first and second fins. The CMOS FinFET device further includes a first portion of the first fin comprising a material that is the same material as the substrate and a second portion of the first fin comprising a III-V semiconductor material deposited over the first portion of the first fin. The CMOS FinFET device further includes a first portion of the second fin comprising a material that is the same material as the substrate and a second portion of the second fin comprising a germanium (Ge) material deposited over the first portion of the second fin. The CMOS FinFET device further includes a gate structure disposed on a central portion of the first fin including the III-V semiconductor material separating source and drain regions of a N-type metal-oxide-semiconductor (NMOS) fin-like field effect transistor (FinFET) device of the CMOS FinFET device and disposed on a central portion of the second fin including the Ge material separating source and drain regions of a P-type metal-oxide-semiconductor (PMOS) fin-like field effect transistor (FinFET) device of the CMOS FinFET device. The source and drain regions of the NMOS device define a channel region of the NMOS device therebetween, and the source and drain regions of the PMOS device define a channel region of the PMOS device therebetween.

In some embodiments, the CMOS FinFET device further includes a third portion of the first fin comprising a first doped semiconductor material deposited over the second portion of the first fin in the source and drain regions of the NMOS device and a third portion of the second fin comprising a second doped semiconductor material deposited over the second portion of the second fin in the source and drain regions of the PMOS device.

In some embodiments, the first doped semiconductor material is different than the second doped semiconductor material, the first doped semiconductor material is not included in the channel region of the NMOS device, the second doped semiconductor material is not included in the channel region of the PMOS device, the third portion of the first fin extends above the insulation material at a first height, and the third portion of the second fin extends above the insulation material at a second height, the second and first heights being substantially the same. In various embodiments, the third portion of the first fin extends above the insulation material at a first height, and the third portion of the second fin extends above the insulation material at a second height, the second and first heights being substantially the same. In certain embodiments, the second portion of the first fin extends above the insulation material at a first height, and the second portion of the second fin extends above the insulation material at a second height, the second and first heights being substantially the same. In further embodiments, the substrate is selected from the group consisting of bulk silicon and silicon-on-insulator (SOI). In some embodiments, the gate structure includes a gate dielectric layer, a gate electrode disposed over the gate dielectric layer, and a gate spacer disposed on a sidewall of the gate electrode.

Also provided is a method of forming a CMOS FinFET device. The method includes providing a substrate including first and second regions. The method further includes forming a fin structure including first and second fins over the substrate. The first fin is formed in the first region and the second fin is formed in the second region. The method further includes depositing an insulation material over the fin structure such that the first fin is interposed between the insulation material in the first region and the second fin is interposed between the insulation material in the second region. The method further includes etching back the first fin interposed between the insulation material in the first region and the second fin interposed between the insulation material in the second region. The method further includes epitaxially (epi) growing a III-V semiconductor material over the etched-back first fin and between the insulation material in the first region. The method further includes epi growing a germanium (Ge) material over the etched-back second fin and between the insulation material in the second region. The method further includes etching back the insulation material thereby defining the a first height of the first fin and a second height of the second fin, the first height being measured from a top surface of the insulation material to a top surface of the III-V semiconductor material of the first fin and the second height being measured from the top surface of the insulation material to a top surface of the Ge material of the second fin.

In some embodiments, the method further includes forming a first gate structure over a central portion of the III-V semiconductor material of the first fin, the first gate structure separating source and drain regions of a N-type metal-oxide-semiconductor (NMOS) fin-like field effect transistor (FinFET) device of the CMOS FinFET device; and forming a second gate structure over a central portion of the Ge material of the second fin, the second gate structure separating source and drain regions of a P-type metal-oxide-semiconductor (PMOS) fin-like field effect transistor (FinFET) device of the CMOS FinFET device. In certain embodiments, the method further includes etching back the III-V semiconductor material of the first fin such that another top surface of the III-V semiconductor material of the first fin is defined; etching back the Ge material of the second fin such that another top surface of the Ge material of the second fin is defined; epi growing a first doped semiconductor material over the another top surface of the III-V semiconductor material of the first fin in the first region; and epi growing a second doped semiconductor material over the another top surface of the Ge material of the second fin in the second region.

In some embodiments, the source and drain regions of the NMOS device define a channel region of the NMOS device therebetween, the channel region of the NMOS device includes the III-V semiconductor material of the first fin, the source and drain regions of the PMOS device define a channel region of the PMOS device therebetween, and the channel region of the PMOS device includes the Ge material of the second fin. In various embodiments, epi growing the III-V semiconductor material over the first fin includes: forming a first hardmask over the first and second regions; patterning the first hardmask such that the first region including the first fin is exposed and the second region including the second fin is protected; and epitaxially growing the III-V semiconductor material over the exposed first fin and between the insulation material in the first region; and epi growing the Ge material over the second fin includes: forming a second hardmask over the first and second regions; patterning the second hardmask such that the second region including the second fin is exposed and the first region including the first fin including the epi grown III-V semiconductor material is protected; and epitaxially growing the Ge material over the exposed second fin and between the insulation material in the second region. In certain embodiments, epi growing the Ge material over the second fin includes: forming a second hardmask over the first and second regions; patterning the second hardmask such that the second region including the second fin is exposed and the first region including the first fin is protected; and epitaxially growing the Ge material over the exposed second fin and between the insulation material in the second region; and epi growing the III-V semiconductor material over the first fin includes: forming a first hardmask over the first and second regions; patterning the first hardmask such that the first region including the first fin is exposed and the second region including the second fin including the epi grown Ge material is protected; and epitaxially growing the III-V semiconductor material over the exposed first fin and between the insulation material in the first region. In some embodiments, epi growing the III-V semiconductor material over the first fin includes: epi growing the III-V semiconductor material over the first and second fins and between the insulation material; and epi growing the Ge material over the second fin includes: removing the epi grown III-V semiconductor material over the second fin and between the insulation material; forming a hardmask over the first and second regions; patterning the hardmask such that the second region including the second fin is exposed and the first region including the first fin is protected; and epitaxially growing the Ge material over the exposed second fin and between the insulation material. In various embodiments, epi growing the Ge material over the second fin includes: epi growing the Ge material over the first and second fins and between the insulation material; and epi growing the III-V semiconductor material over the first fin includes: removing the epi grown Ge material over the first fin and between the insulation material; forming a hardmask over the first and second regions; patterning the hardmask such that the first region including the first fin is exposed and the second region including the second fin is protected; and epitaxially growing the III-V semiconductor material the exposed first fin and between the insulation material.

Also provided is an alternative method of forming a CMOS FinFET device. The method includes providing a substrate including first and second regions. The method further includes forming a first fin in the first region and a second fin in the second region. The method further includes depositing an insulation material over the first and second fins. The method further includes etching the first fin between the insulation material such that a first trench is formed, the first trench including a bottom surface, the bottom surface of the first trench being the top surface of a first portion of the first fin. The method further includes etching the second fin between the insulation material such that a second trench is formed, the second trench including a bottom surface, the bottom surface of the second trench being the top surface of a first portion of the second fin. The method further includes forming a first hardmask over the first and second regions. The method further includes patterning the first hardmask such that the first region including the first trench is exposed and the second region is protected. The method further includes epitaxially (epi) growing a III-V semiconductor material in the exposed first trench on the top surface of the first portion of the first fin, thereby forming a second portion of the first fin. The method further includes performing a planarizing process on the CMOS FinFET device such that excess III-V material is removed from the first region and the first hardmask is removed from the second region. The method further includes forming a second hardmask over the first and second regions. The method further includes patterning the second hardmask such that the second region including the second trench is exposed and the first region is protected. The method further includes epi growing a germanium (Ge) material in the second trench on the top surface of the first portion of the second fin, thereby forming a second portion of the second fin. The method further includes performing a planarizing process on the CMOS FinFET device such that excess Ge material is removed from the second region and the second hardmask is removed from the first region. The method further includes etching back the insulation material such that first and second sidewalls of the III-V semiconductor material of the first fin are exposed and first and second sidewalls of the Ge material of the second fin are exposed.

In some embodiments, the method further includes forming a first gate structure over a central portion of the III-V semiconductor material of the first fin, the first gate structure separating source and drain regions of a N-type metal-oxide-semiconductor (NMOS) fin-like field effect transistor (FinFET) device of the CMOS FinFET device; and forming a second gate structure over a central portion of the Ge material of the second fin, the second gate structure separating source and drain regions of a P-type metal-oxide-semiconductor (PMOS) fin-like field effect transistor (FinFET) device of the CMOS FinFET device. In further embodiments, forming the first gate structure includes forming a first gate dielectric and a first gate electrode over the first gate dielectric, and forming the second gate structure includes forming a second gate dielectric and a second gate electrode over the second gate dielectric. In still further embodiments, the source and drain regions of the NMOS device define a channel region of the NMOS device therebetween, the channel region of the NMOS device includes the III-V semiconductor material of the first fin, the source and drain regions of the PMOS device define a channel region of the PMOS device therebetween, and the channel region of the PMOS device includes the Ge material of the second fin.

In some embodiments, the method further includes etching back the III-V semiconductor material of the first fin in the source and drain regions of the NMOS device such that a top surface of the III-V semiconductor material of the first fin is defined; etching back the Ge material of the second fin in the source and drain regions of the PMOS device such that a top surface of the Ge material of the second fin is defined; epi growing a first doped semiconductor material over the top surface of the III-V semiconductor material of the first fin in the source and drain regions of the NMOS device; and epi growing a second doped semiconductor material over the top surface of the Ge material of the second fin in the source and drain regions of the PMOS device, the first doped semiconductor material is different than the second doped semiconductor material, the first doped semiconductor material is not included in the channel region of the NMOS device, and the second doped semiconductor material is not included in the channel region of the PMOS device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a CMOS FinFET device, comprising:
    providing a substrate including first and second regions;
    forming a fin structure including first and second fins over the substrate, the first fin being formed in the first region and the second fin being formed in the second region;
    depositing an insulation material over the fin structure such that the first fin is interposed between the insulation material in the first region and the second fin is interposed between the insulation material in the second region;
    etching back the first fin interposed between the insulation material in the first region and the second fin interposed between the insulation material in the second region;
    epitaxially (epi) growing a III-V semiconductor material over the etched-back first fin and between the insulation material in the first region;
    epi growing a germanium (Ge) material over the etched-back second fin and between the insulation material in the second region; and
    etching back the insulation material thereby defining the a first height of the first fin and a second height of the second fin, the first height being measured from a top surface of the insulation material to a top surface of the III-V semiconductor material of the first fin and the second height being measured from the top surface of the insulation material to a top surface of the Ge material of the second fin.

2. The method of claim 1 further comprising:
    forming a first gate structure over a central portion of the III-V semiconductor material of the first fin, the first gate structure separating source and drain regions of a N-type metal-oxide-semiconductor (NMOS) fin-like field effect transistor (FinFET) device of the CMOS FinFET device; and
    forming a second gate structure over a central portion of the Ge material of the second fin, the second gate structure separating source and drain regions of a P-type metal-oxide-semiconductor (PMOS) fin-like field effect transistor (FinFET) device of the CMOS FinFET device.

3. The method of claim 2 wherein the source and drain regions of the NMOS device define a channel region of the NMOS device therebetween,
    wherein the channel region of the NMOS device includes the III-V semiconductor material of the first fin, wherein the source and drain regions of the PMOS device define a channel region of the PMOS device therebetween, and wherein the channel region of the PMOS device includes the Ge material of the second fin.

4. The method of claim 1 further comprising:

etching back the III-V semiconductor material of the first fin such that another top surface of the III-V semiconductor material of the first fin is defined;

etching back the Ge material of the second fin such that another top surface of the Ge material of the second fin is defined;

epi growing a first doped semiconductor material over the another top surface of the III-V semiconductor material of the first fin in the first region; and epi growing a second doped semiconductor material over the another top surface of the Ge material of the second fin in the second region.

5. The method of claim 1 wherein epi growing the III-V semiconductor material over the first fin includes:

forming a first hardmask over the first and second regions;

patterning the first hardmask such that the first region including the first fin is exposed and the second region including the second fin is protected; and epi growing the III-V semiconductor material over the exposed first fin and between the insulation material in the first region; and wherein epi growing the Ge material over the second fin includes:

forming a second hardmask over the first and second regions;

patterning the second hardmask such that the second region including the second fin is exposed and the first region including the first fin including the III-V semiconductor material is protected; and epi growing the Ge material over the exposed second fin and between the insulation material in the second region.

6. The method of claim 1 wherein epi growing the Ge material over the second fin includes:

forming a second hardmask over the first and second regions;

patterning the second hardmask such that the second region including the second fin is exposed and the first region including the first fin is protected; and epi growing the Ge material over the exposed second fin and between the insulation material in the second region; and wherein epi growing the III-V semiconductor material over the first fin includes:

forming a first hardmask over the first and second regions;

patterning the first hardmask such that the first region including the first fin is exposed and the second region including the second fin including the Ge material is protected; and epi growing the III-V semiconductor material over the exposed first fin and between the insulation material in the first region.

7. The method of claim 1 wherein epi growing the III-V semiconductor material over the first fin includes:

epi growing the III-V semiconductor material over the first and second fins and between the insulation material; and wherein epi growing the Ge material over the second fin includes:

removing the III-V semiconductor material over the second fin and between the insulation material;

forming a hardmask over the first and second regions;

patterning the hardmask such that the second region including the second fin is exposed and the first region including the first fin is protected; and epi growing the Ge material over the exposed second fin and between the insulation material.

8. The method of claim 1 wherein epi growing the Ge material over the second fin includes:

epi growing the Ge material over the first and second fins and between the insulation material; and wherein epi growing the III-V semiconductor material over the first fin includes:

removing the Ge material over the first fin and between the insulation material;

forming a hardmask over the first and second regions;

patterning the hardmask such that the first region including the first fin is exposed and the second region including the second fin is protected; and epi growing the III-V semiconductor material the exposed first fin and between the insulation material.

9. A method of forming a CMOS FinFET device comprising:

providing a substrate including first and second regions;

forming a first fin in the first region and a second fin in the second region;

depositing an insulation material over the first and second fins;

etching the first fin between the insulation material such that a first trench is formed, the first trench including a bottom surface, the bottom surface of the first trench being the top surface of a first portion of the first fin;

etching the second fin between the insulation material such that a second trench is formed, the second trench including a bottom surface, the bottom surface of the second trench being the top surface of a first portion of the second fin;

forming a first hardmask over the first and second regions;

patterning the first hardmask such that the first region including the first trench is exposed and the second region is protected;

epitaxially (epi) growing a III-V semiconductor material in the exposed first trench on the top surface of the first portion of the first fin, thereby forming a second portion of the first fin;

performing a planarizing process on the CMOS FinFET device such that excess III-V material is removed from the first region and the first hardmask is removed from the second region;

forming a second hardmask over the first and second regions;

patterning the second hardmask such that the second region including the second trench is exposed and the first region is protected;

epi growing a germanium (Ge) material in the second trench on the top surface of the first portion of the second fin, thereby forming a second portion of the second fin;

performing a planarizing process on the CMOS FinFET device such that excess Ge material is removed from the second region and the second hardmask is removed from the first region; and etching back the insulation material such that first and second sidewalls of the III-V semiconductor material of the first fin are exposed and first and second sidewalls of the Ge material of the second fin are exposed.

10. The method of claim 9 further comprising:

forming a first gate structure over a central portion of the III-V semiconductor material of the first fin, the first gate structure separating source and drain regions of a N-type metal-oxide-semiconductor (NMOS) fin-like field effect transistor (FinFET) device of the CMOS FinFET device; and forming a second gate structure over a central portion of the Ge material of the second fin, the second gate structure separating source and drain regions of a P-type metal-oxide-semiconductor (PMOS) fin-like field effect transistor (FinFET) device of the CMOS FinFET device.

11. The method of claim 10 wherein forming the first gate structure includes forming a first gate dielectric and a first gate electrode over the first gate dielectric, and wherein forming the second gate structure includes forming a second gate dielectric and a second gate electrode over the second gate dielectric.

12. The method of claim 10 wherein the source and drain regions of the NMOS device define a channel region of the NMOS device therebetween, wherein the channel region of the NMOS device includes the III-V semiconductor material of the first fin, wherein the source and drain regions of the PMOS device define a channel region of the PMOS device therebetween, and wherein the channel region of the PMOS device includes the Ge material of the second fin.

13. The method of claim 12 further comprising:

etching back the III-V semiconductor material of the first fin in the source and drain regions of the NMOS device such that a top surface of the III-V semiconductor material of the first fin is defined;

etching back the Ge material of the second fin in the source and drain regions of the PMOS device such that a top surface of the Ge material of the second fin is defined;

epi growing a first doped semiconductor material over the top surface of the III-V semiconductor material of the first fin in the source and drain regions of the NMOS device; and epi growing a second doped semiconductor material over the top surface of the Ge material of the second fin in the source and drain regions of the PMOS device, wherein the first doped semiconductor material is different than the second doped semiconductor material, wherein the first doped semiconductor material is not included in the channel region of the NMOS device, and wherein the second doped semiconductor material is not included in the channel region of the PMOS device.

14. A method of forming a CMOS FinFET device comprising:

forming a fin structure disposed over a substrate, including a first fin in a first region of the substrate and a second fin in a second region of the substrate, wherein first portions of the first and second fins include a material that is the same material as the substrate, wherein a second portion of the first fin includes a III-V semiconductor material deposited over the first portion of the first fin, and wherein a second portion of the second fin includes a germanium (Ge) material deposited over the first portion of the second fin;

depositing an insulation material between the first and second fins;

forming a gate structure on a central portion of the first fin including the III-V semiconductor material, the gate structure separating source and drain regions of an N-type metal-oxide-semiconductor (NMOS) fin-like field effect transistor (FinFET) device of the CMOS FinFET device wherein the source and drain regions of the NMOS device define a channel region of the NMOS device therebetween; and forming the gate structure on a central portion of the second fin including the Ge material separating source and drain regions of a P-type metal-oxide-semiconductor (PMOS) fin-like field effect transistor (FinFET) device of the CMOS FinFET device, wherein the source and drain regions of the PMOS device define a channel region of the PMOS device therebetween.

15. The method of claim 14 wherein a third portion of the first fin includes a first doped semiconductor material deposited over the second portion of the first fin in the source and drain regions of the NMOS device, and wherein a third portion of the second fin includes a second doped semiconductor material deposited over the second portion of the second fin in the source and drain regions of the PMOS device.

16. The method of claim 15, wherein the first doped semiconductor material is different than the second doped semiconductor material, wherein the first doped semiconductor material is not included in the channel region of the NMOS device, wherein the second doped semiconductor material is not included in the channel region of the PMOS device, wherein the third portion of the first fin extends above the insulation material at a first height, and wherein the third portion of the second fin extends above the insulation material at a second height, the second and first heights being substantially the same.

17. The method of claim 16 wherein the third portion of the first fin extends above the insulation material at a first height, and wherein the third portion of the second fin extends above the insulation material at a second height, the second and first heights being substantially the same.

18. The method of claim 14 wherein the second portion of the first fin extends above the insulation material at a first height, and wherein the second portion of the second fin extends above the insulation material at a second height, the second and first heights being substantially the same.

19. The method of claim 14 wherein the substrate is selected from the group consisting of bulk silicon and silicon-on-insulator (SOI).

20. The method of claim 14 wherein the gate structure includes a gate dielectric layer, a gate electrode disposed over the gate dielectric layer, and a gate spacer disposed on a sidewall of the gate electrode.

* * * * *